US008743615B2

(12) United States Patent
Lee et al.

(10) Patent No.: US 8,743,615 B2
(45) Date of Patent: Jun. 3, 2014

(54) READ COMPENSATION FOR PARTIALLY PROGRAMMED BLOCKS OF NON-VOLATILE STORAGE

(75) Inventors: Dana Lee, Saratoga, CA (US); Ken Oowada, Fujisawa (JP)

(73) Assignee: SanDisk Technologies Inc., Plano, TX (US)

( * ) Notice: Subject to any disclaimer, the term of this patent is extended or adjusted under 35 U.S.C. 154(b) by 361 days.

(21) Appl. No.: 13/214,765

(22) Filed: Aug. 22, 2011

(65) Prior Publication Data
US 2013/0051148 A1 Feb. 28, 2013

(51) Int. Cl.
*G11C 16/04* (2006.01)
*G11C 16/06* (2006.01)

(52) U.S. Cl.
USPC ............ 365/185.18; 365/185.02; 365/185.09; 365/185.1; 365/185.11

(58) Field of Classification Search
USPC ............... 365/185.02, 185.1, 185.09, 185.11, 365/185.18
See application file for complete search history.

(56) References Cited

U.S. PATENT DOCUMENTS

| | | | |
|---|---|---|---|
| 5,867,429 | A | 2/1999 | Chen et al. |
| 6,046,935 | A * | 4/2000 | Takeuchi et al. .......... 365/185.03 |
| 6,522,580 | B2 | 2/2003 | Chen et al. |
| 6,643,188 | B2 | 11/2003 | Tanaka et al. |
| 7,499,319 | B2 | 3/2009 | Mokhlesi |
| 7,561,473 | B2 | 7/2009 | Mokhlesi et al. |
| 7,606,070 | B2 | 10/2009 | Mokhlesi |
| 7,684,247 | B2 | 3/2010 | Mokhlesi |
| 7,791,938 | B2 | 9/2010 | Kang et al. |
| 7,848,144 | B2 | 12/2010 | Lasser |
| 7,889,560 | B2 | 2/2011 | Guterman |
| 7,911,838 | B2 | 3/2011 | Mokhlesi |
| 2006/0221692 | A1 | 10/2006 | Chen |
| 2007/0153583 | A1 | 7/2007 | Guterman |
| 2007/0189073 | A1 * | 8/2007 | Aritome .................... 365/185.18 |
| 2009/0034337 | A1 * | 2/2009 | Aritome .................... 365/185.18 |

OTHER PUBLICATIONS

International Search Report and Written Opinion of the International Searching Authority dated Jan. 25, 2013, PCT Application No. PCT/US2012/051797, filed Aug. 22, 2012, 8 pages.

* cited by examiner

*Primary Examiner* — Thao H Bui
(74) *Attorney, Agent, or Firm* — Vierra Magen Marcus LLP

(57) ABSTRACT

Read compensation for partially programmed blocks of non-volatile storage is provided. In partially programmed blocks, the threshold voltage distributions may be shifted down relative to their final positions. Upon receiving a request to read a page that is stored in a block, a determination may be made whether the block is partially programmed. If so, then a suitable compensation may be made when reading the requested page. This compensation may compensate for the non-volatile storage elements (or pages) in the block that have not yet been programmed. The amount of compensation may be based on the amount of interference that would be caused to the requested page by later programming of the other pages. The compensation may compensate for shifts in threshold voltage distributions of the requested page that would occur from later programming of other pages.

29 Claims, 19 Drawing Sheets

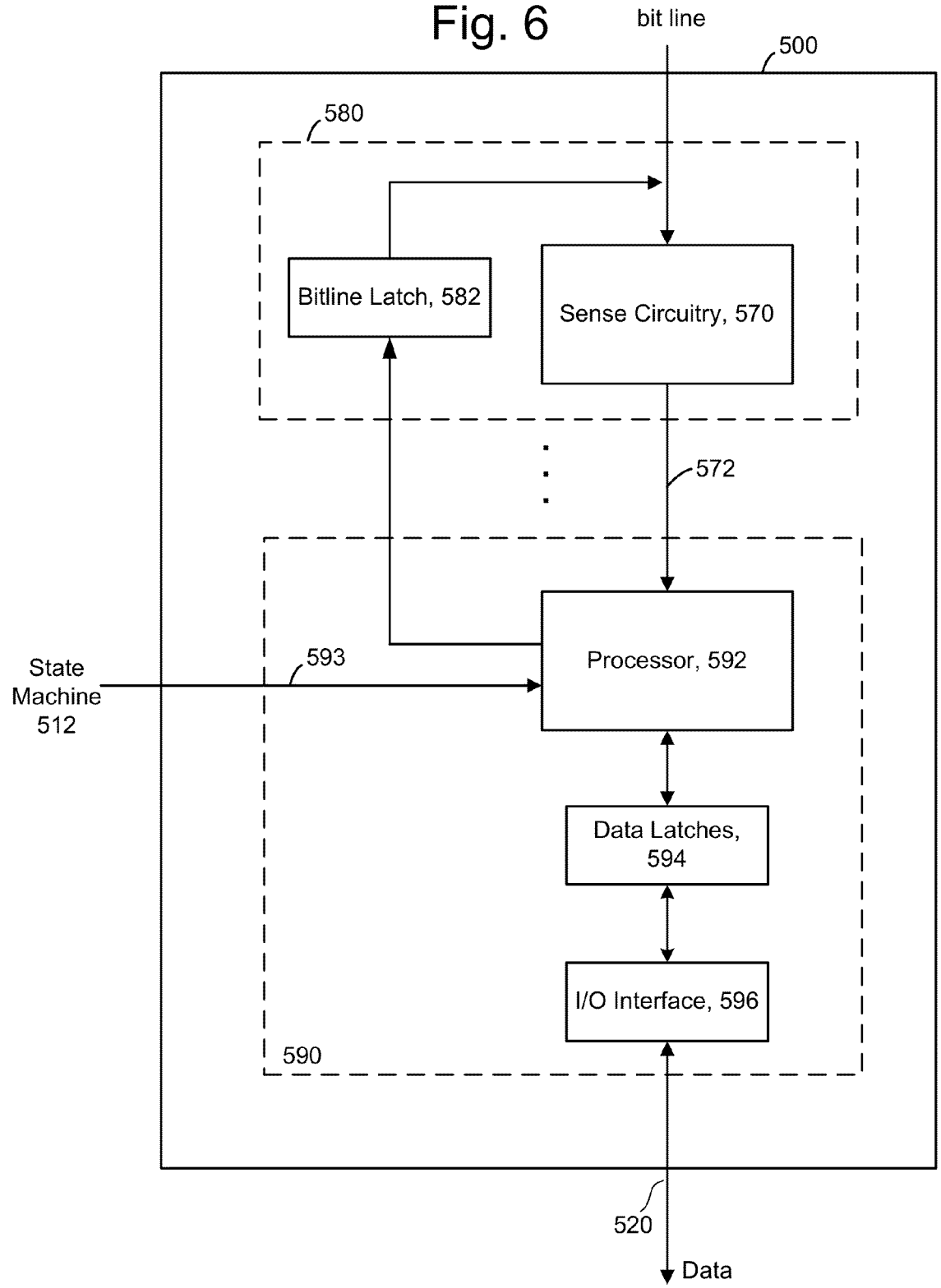

First programming pass

Second programming pass

| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |

Fig. 8B

| Wordline | Upper/ Lower Page | Even Bit Lines | Odd Bit Lines |
|---|---|---|---|
| WL3 | upper | Page 14 | Page 15 |
|  | lower | Page 10 | Page 11 |
| WL2 | upper | Page 12 | Page 13 |
|  | lower | Page 6 | Page 7 |
| WL1 | upper | Page 8 | Page 9 |
|  | lower | Page 2 | Page 3 |
| WL0 | upper | Page 4 | Page 5 |
|  | lower | Page 0 | Page 1 |

| Wordline | all bit lines |
|---|---|
| WL3 | Page 3 |
| WL2 | Page 2 |
| WL1 | Page 1 |
| WL0 | Page 0 |

Fig. 18B

| Wordline | Even Bit Lines | Odd Bit Lines |
|---|---|---|
| WL3 | Page 6 | Page 7 |
| WL2 | Page 4 | Page 5 |
| WL1 | Page 2 | Page 3 |
| WL0 | Page 0 | Page 1 |

Fig. 18C

| Wordline | Upper/ Lower Page | All Bit Lines |
|---|---|---|
| WL3 | upper | Page 7 |
| | lower | Page 6 |
| WL2 | upper | Page 5 |
| | lower | Page 4 |
| WL1 | upper | Page 3 |
| | lower | Page 2 |
| WL0 | upper | Page 1 |
| | lower | Page 0 |

Fig. 18D

| Wordline | Upper/ Lower Page | Even Bit Lines | Odd Bit Lines |
|---|---|---|---|
| WL3 | upper | Page 14 | Page 15 |
| | lower | Page 12 | Page 13 |
| WL2 | upper | Page 10 | Page 11 |
| | lower | Page 8 | Page 9 |
| WL1 | upper | Page 6 | Page 7 |
| | lower | Page 4 | Page 5 |
| WL0 | upper | Page 2 | Page 3 |
| | lower | Page 0 | Page 1 |

| Wordline | Upper/Lower Page | Even Bit Lines | Odd Bit Lines |
|---|---|---|---|
| WL3 | upper | Page 13 | Page 15 |
| | lower | Page 12 | Page 14 |
| WL2 | upper | Page 9 | Page 11 |
| | lower | Page 8 | Page 10 |
| WL1 | upper | Page 5 | Page 7 |
| | lower | Page 4 | Page 6 |
| WL0 | upper | Page 1 | Page 3 |
| | lower | Page 0 | Page 2 |

Fig. 18E

READ COMPENSATION FOR PARTIALLY PROGRAMMED BLOCKS OF NON-VOLATILE STORAGE

BACKGROUND

The present disclosure relates to technology for non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. The array of storage elements may be divided into a large number of blocks of storage elements.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, electromagnetic coupling effects in memory devices are becoming increasingly important as memory device dimensions are scaled down.

BRIEF DESCRIPTION OF THE DRAWINGS

FIG. 6 is a block diagram depicting one embodiment of the sense block.

FIGS. 8B and 8C describe two possible orders for programming memory cells.

FIGS. 18A, 18B, 18C, 18D and 18E depict tables of page programming sequences that may be used when applying partial block compensation.

DETAILED DESCRIPTION

Figure 1A:
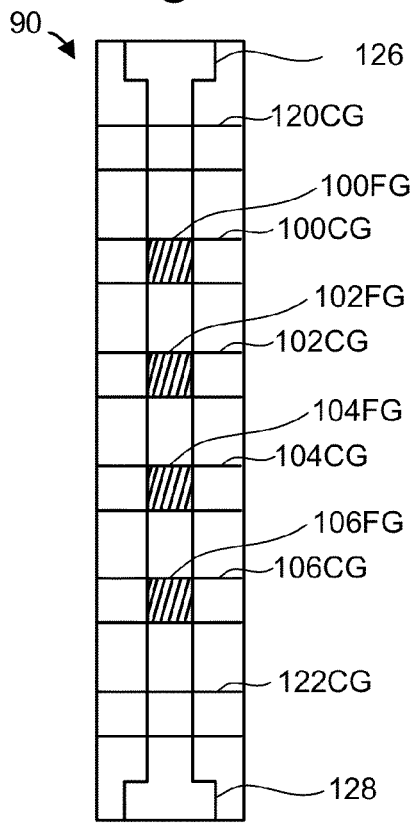
FIG. 1A is a top view of one embodiment of a NAND string.

Methods and non-volatile storage systems are provided for reading partially programmed blocks of non-volatile storage. Note that the reading could take place during a read operation or a verify operation.

In some embodiments, a block of non-volatile storage elements is programmed in a sequence of pages. A page is a unit of programming. Typically, one or more pages are programmed in non-volatile storage elements associated with a given word line. At a point in time, the block may be partially programmed. That is, not all of the pages have been programmed yet. In other words, non-volatile storage elements that are designated to store certain pages have not yet been programmed.

In partially programmed blocks, the threshold voltage distributions of storage elements associated with some of the pages may be lower than their final positions. A possible reason for this shift is that when other pages are programmed at a later time, the threshold voltage distributions of storage elements associated with previously programmed pages may be shifted up. Therefore, if a partially programmed block is to be read, the threshold voltage distributions for storage elements associated with some of the pages may be different than expected for a fully programmed block. This may lead to a loss of detection margin during read operations. Read compensation is provided for partially programmed blocks, in accordance with embodiments disclosed herein. The compensation may compensate for shifts in threshold voltage distributions of the target page that would occur from later programming of other pages.

Upon receiving a request to read a page that is stored in a block, a determination may be made whether the block is partially programmed. If so, then a suitable compensation may be made when reading the requested (or target) page. This compensation may compensate for the non-volatile storage elements in the block that have not yet been programmed. The amount of compensation may be based on the amount of interference that would be caused to the requested page by programming of the other pages at a later time.

In one embodiment, a determination is made whether certain pages in the sequence that follow the requested page have been programmed yet. For example, if non-volatile storage elements that are near the target non-volatile storage elements have not yet been programmed, then the read levels may be compensated when reading the target non-volatile storage elements. As one example, if non-volatile storage elements that are associated with a neighboring word line have not yet been programmed, then read level compensation may be used.

In one embodiment, a page is programmed in every other non-volatile storage element on a given word line. For example, non-volatile storage elements on a given word line that are associated with odd bit lines are programmed with one page. And non-volatile storage elements on that word line that are associated with odd bit lines are programmed with another page. A determination may be made whether the other page on the word line has been written yet. If it has not been written, then the read levels may be adjusted when reading the requested page.

Figure 1B:
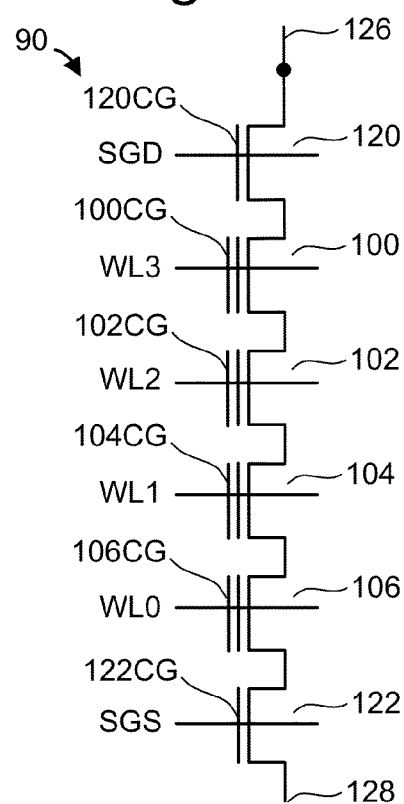
FIG. 1B is an equivalent circuit diagram of the NAND string.

One example of a suitable memory system for implementing embodiments uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively.

Figure 2:
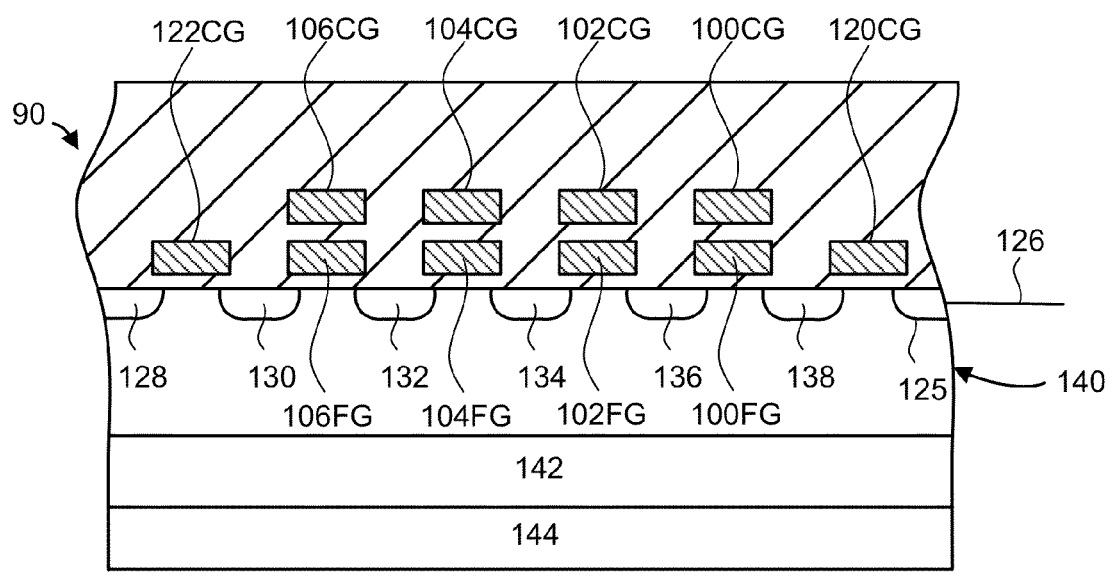
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Some NAND strings will include 8, 16, 32, 64 or more memory cells. Each memory cell can store data represented in analog or digital form, in one or more bits.

Other types of non-volatile memory in addition to NAND flash memory can also be used.

Figure 3:
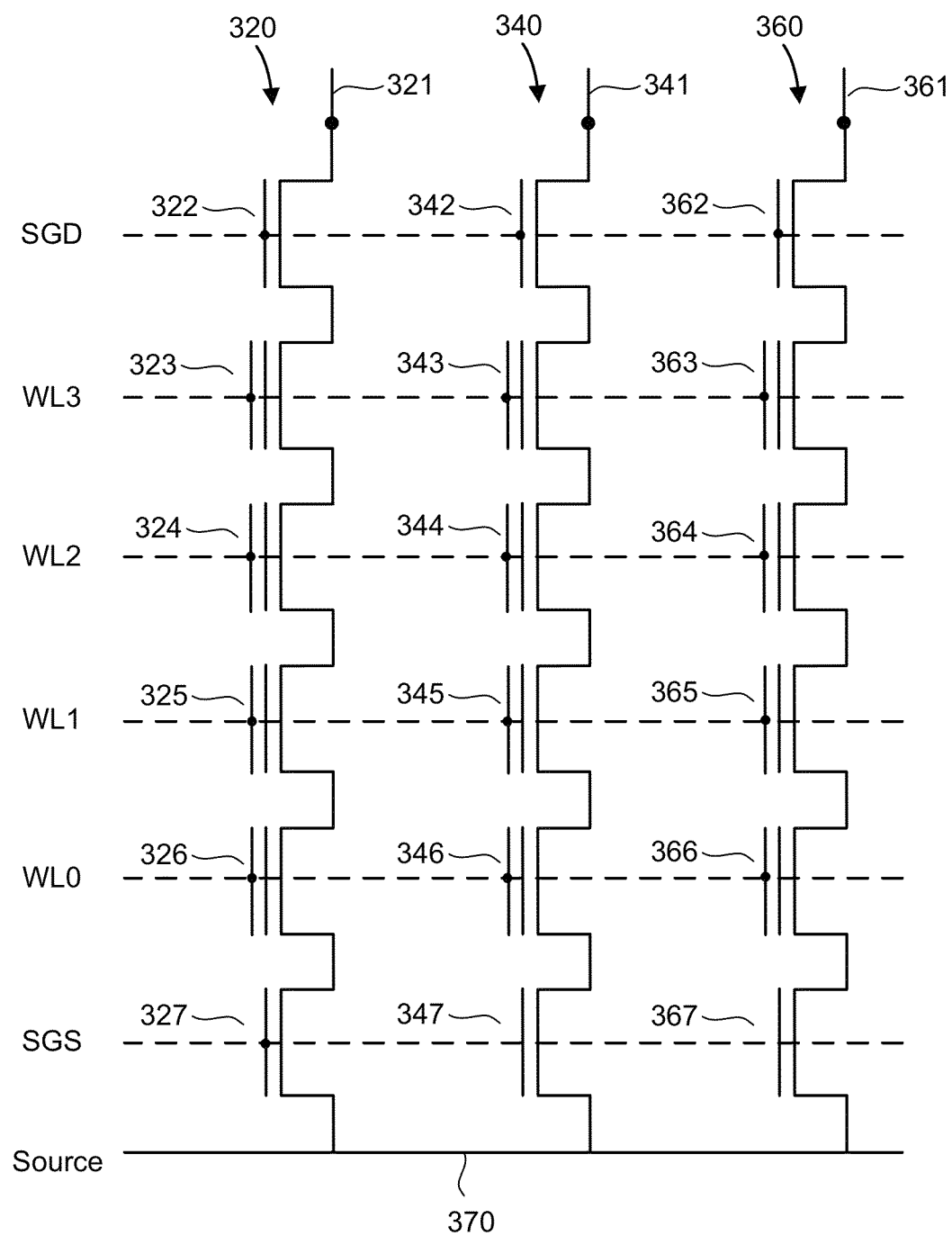
FIG. 3 is a circuit diagram depicting three NAND strings.

FIG. 3 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the word lines themselves.

When programming a flash storage element, a program voltage is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
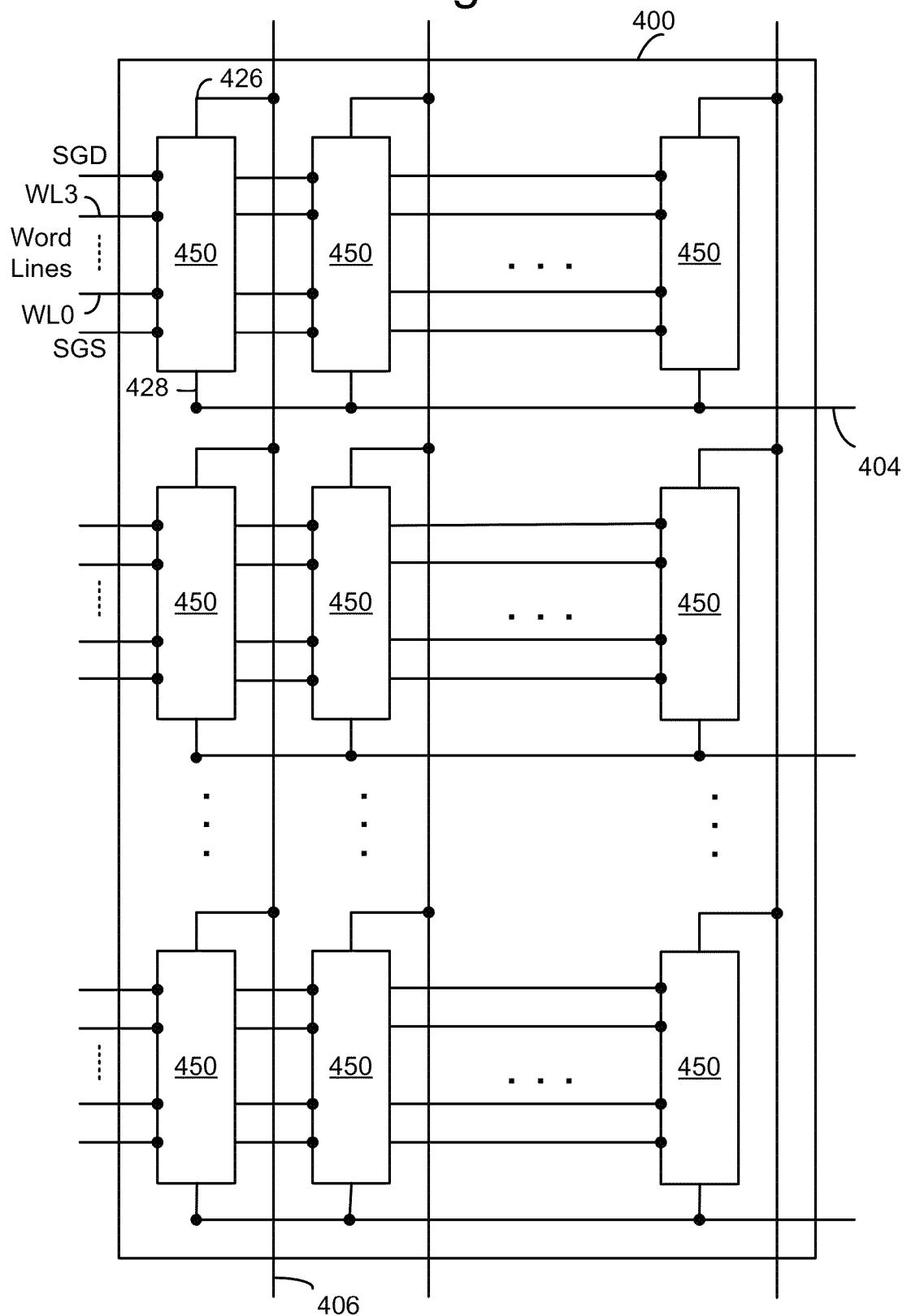
FIG. 4 is a block diagram of one embodiment of an array of NAND flash memory cells.

FIG. 4 illustrates an example of an array 400 of NAND storage elements, such as those shown in FIGS. 1A and 1B. Along each column, a bit line 406 is coupled to the drain terminal 426 of the drain-side select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row may contain interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Note that the storage elements may store user data and overhead data. Overhead data typically includes an Error Correction Code (ECC) that has been calculated from the user data. A portion of the controller (described below) calculates the ECC when data is being programmed into the array, and also checks it when data is being read from the array. Note that the ECCs and/or other overhead data may be stored in the same page as the user data, or in different pages, or even different blocks, than the user data to which they pertain.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, separate blocks, or another unit of cells.

Figure 5:
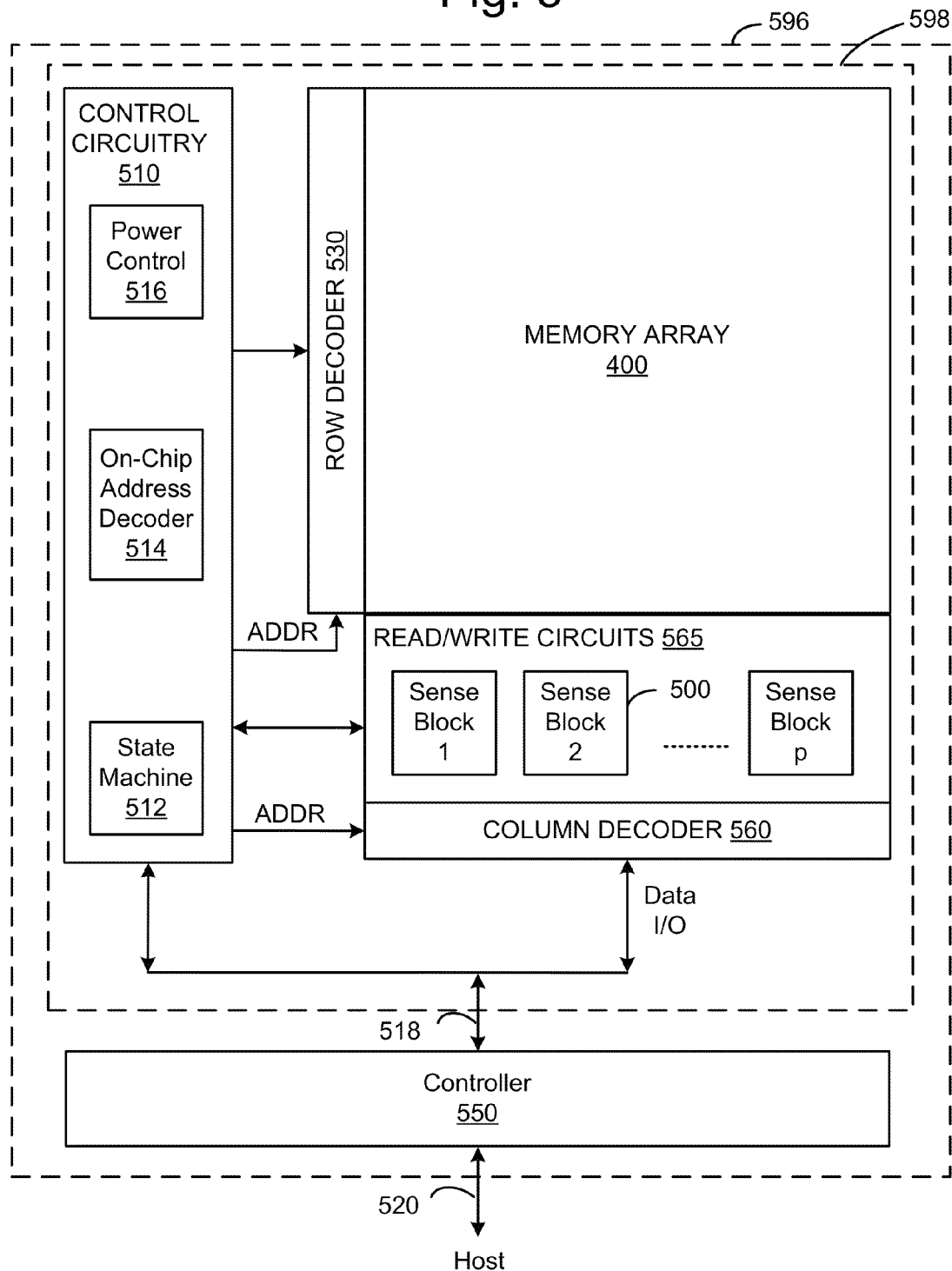
FIG. 5 is a block diagram of one embodiment of a non-volatile memory system.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. A controller 550 may be included in the same memory device 596 (e.g., a removable storage card) as the one or more memory die 598. Commands and data are transferred between the host and controller 550 via lines 520 and between the controller and the one or more memory die 598 via lines 518. However, note that the controller 550 may be outside of the memory device 596.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion

590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
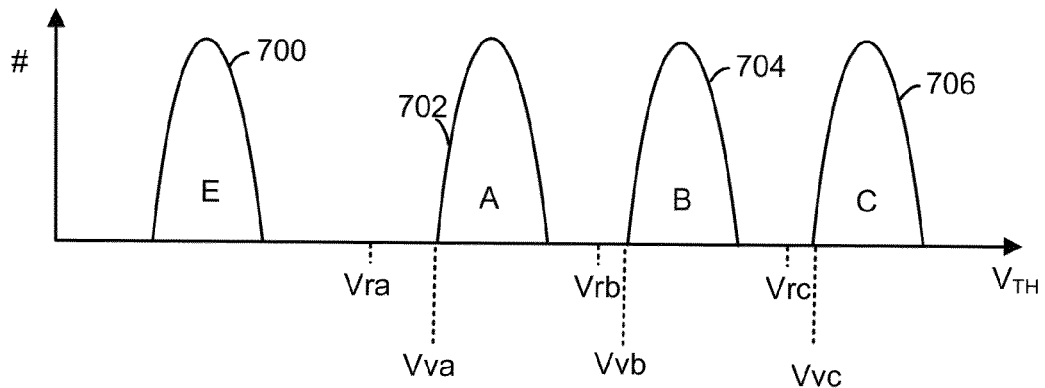
FIG. 7A depicts an example set of threshold voltage distributions for a four-state memory device in which each storage element stores two bits of data.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state are negative and the threshold voltages in the A, B and C distributions are positive. However, all or a part of the threshold distribution in the E-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
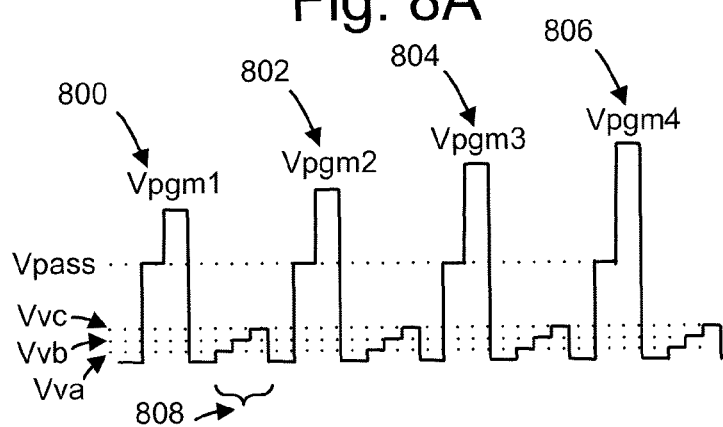
FIG. 8A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8A will then be used to program storage elements directly into states A, B or C. While some storage elements are being programmed from the E-state to the A-state, other storage elements are being programmed from the E-state to the B-state and/or from the E-state to the C-state.

Figure 7B:
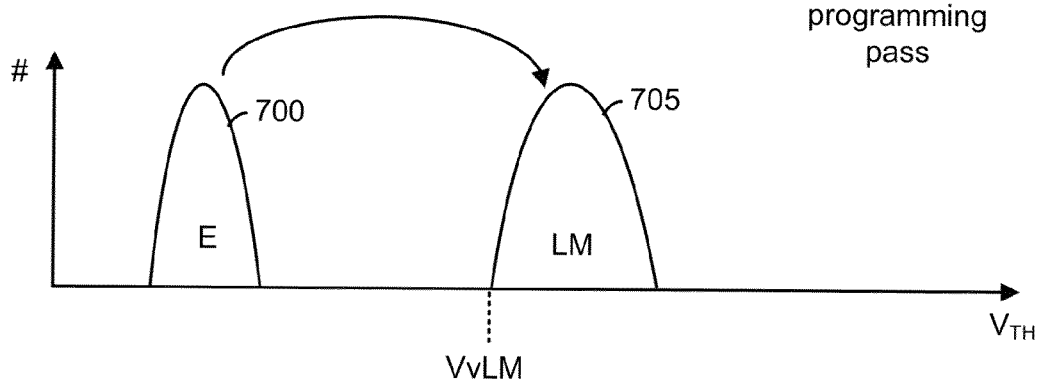
FIG. 7B illustrates a first pass of a two-pass programming technique.

FIG. 7B illustrates a first pass of a two-pass programming technique. In this example, a multi-state storage element that stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 7C:
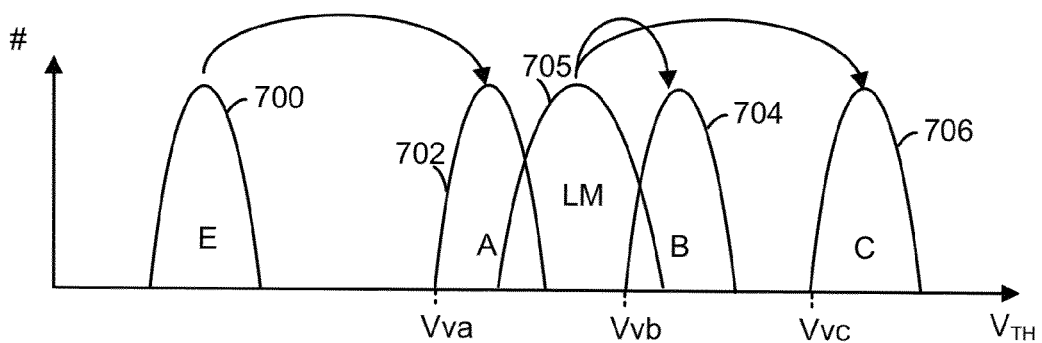
FIG. 7C illustrates a second pass of the two-pass programming technique of FIG. 7B.

FIG. 7C illustrates a second pass of the two-pass programming technique of FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
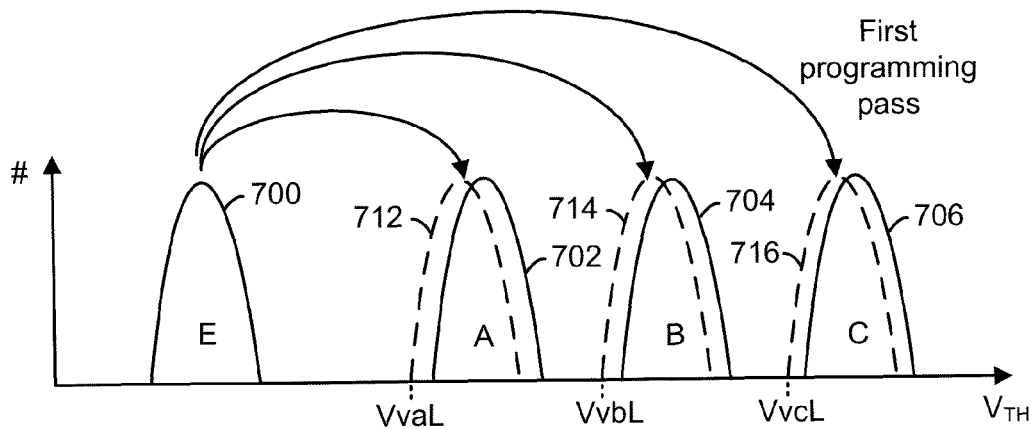
FIG. 7D illustrates a first pass of another foggy-fine two-pass programming technique.

FIG. 7D illustrates a first pass of another two-pass programming technique. In this example, referred to as foggy-fine programming, the A-state, B-state and C-state storage elements are programmed from the E-state to distributions 712, 714 and 716, respectively, using lower verify levels VvaL, VvbL and VvcL, respectively. This is the foggy programming pass. A relatively large program voltage step size may be used, for instance, to quickly program the storage elements to the respective lower verify levels.

Figure 7E:
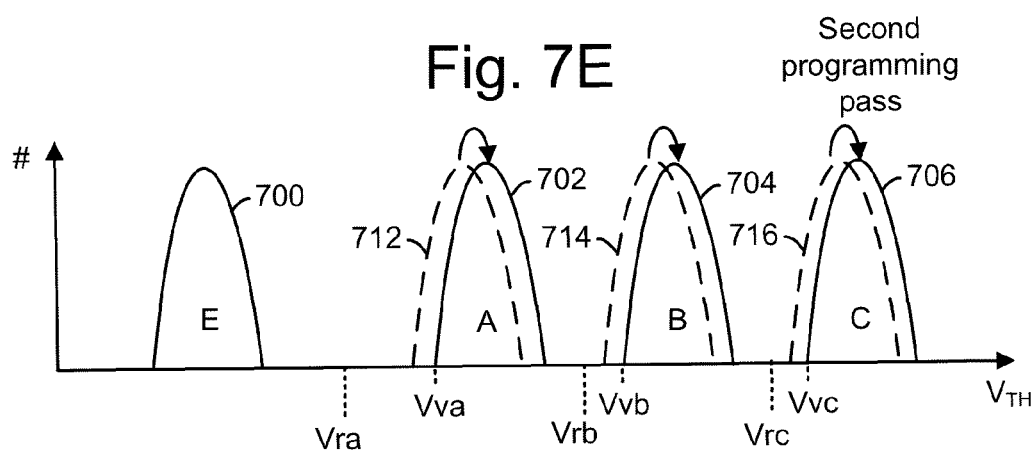
FIG. 7E illustrates a second pass of the two-pass programming technique of FIG. 7D.

FIG. 7E illustrates a second pass of the two-pass programming technique of FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight, sixteen or more states per storage element may be used.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 8A depicts a series of program and verify pulses which are applied to a selected word line during a programming operation. A programming operation may include multiple program-verify iterations, where each iteration applies a program voltage followed by verify voltages, to a selected word line. In one possible approach, the program voltages are stepped up in successive iterations. Moreover, each program voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively, and so forth. One or more verify voltages, such as example verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

FIGS. 8B and 8C describe two possible orders in which pages are programmed into memory cells. FIG. 8B pertains to an architecture that performs all bit line programming. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7.

The table of FIG. 8C pertains to an architecture that performs odd/even programming. For memory cells on even bit lines connected to word line WL0, the lower page forms page 0 and the upper page forms page 4. For memory cells on odd bit lines connected to word line WL0, the lower page forms page 1 and the upper page forms page 5. For memory cells on even bit lines connected to word line WL1, the lower page forms page 2 and the upper page forms page 8. For the memory cells on odd bit lines connected to word line WL1, the lower page forms page 3 and the upper page forms page 9. For the memory cells on even bit lines connected to word line WL2, the lower page forms page 6 and the upper page forms page 12. For the memory cells on odd bit lines connected to word line WL2, the lower page forms page 7 and the upper page forms page 13. For the memory cells on even bit lines connected to word line WL3, the lower page forms page 10 and the upper page forms page 18. For the memory cells on odd bit lines connected to word line WL3, the lower page forms page 11 and the upper page forms page 15. Memory cells are programmed in numerical order according to page number, from page 0 to page 15. Finally, each of the architectures having both even and odd bit lines can be implemented with all the even bit lines located physically together in, for example, the left side of the chip, and all of the odd bit lines located together in, for example, the right side of the chip.

Note that in the embodiments of FIGS. 8B-8C, memory cells are programmed along a NAND string from source side to the drain side. Also, the tables depict only an embodiment with four word lines. The various methods depicted within the tables can be applied to systems with more or fewer than four word lines. Examples of an architecture using odd/even programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; U.S. Pat. No. 6,771,536; U.S. Pat. No. 6,781,877.

Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming. The technology described herein for reading data can also be used for other programming schemes.

Figure 9A:
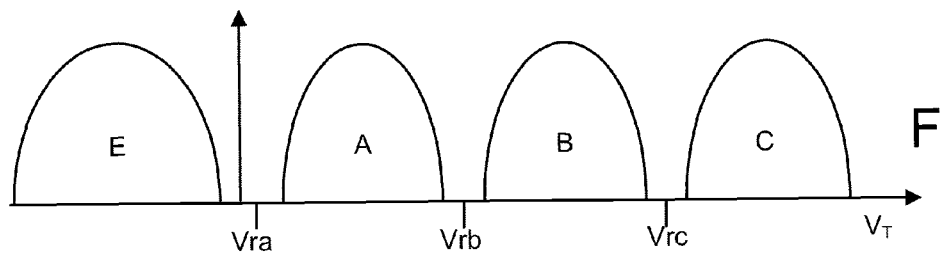
FIGS. 9A, 9B, 9C, and 9D depict threshold voltage distributions for a set of non-volatile storage elements showing shifts that occur as nearby non-volatile storage elements are programmed.
Figure 9B:
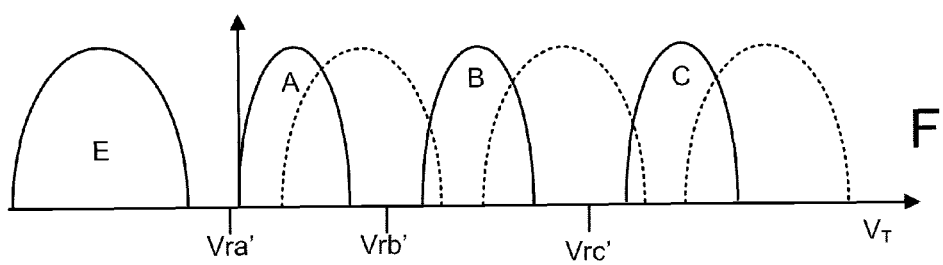
Figure 9C:
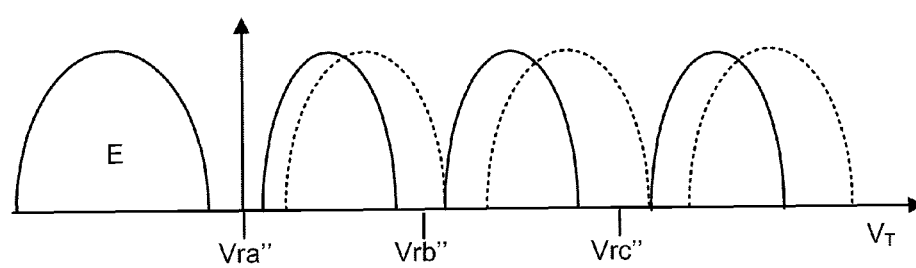
Figure 9D:
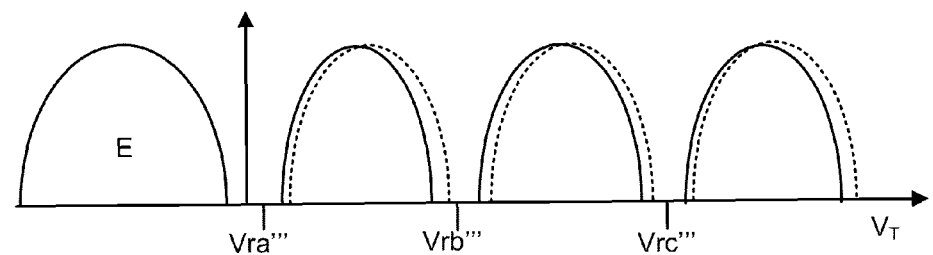

FIGS. 9A-9D depict threshold voltage distributions for a set of non-volatile storage elements showing shifts that occur as nearby non-volatile storage elements are programmed. FIGS. 9A-9D correspond to the programming sequence of FIG. 8C. For the sake of illustration, an example in which the threshold voltage distributions are for page 8 will be described. FIG. 9A shows a set of final distributions after all pages have been programmed in the block. In FIGS. 9A-9D, the solid lines show actual distributions. The dashed distributions in FIGS. 9B-9D are the threshold voltage distributions from FIG. 9A shown for comparison.

FIG. 9B shows actual threshold voltage distributions immediately after programming. For example, the solid lines represent the threshold voltage distributions for page 8 after programming that page. However, note that pages 9, 10, 11, etc. have not yet been programmed. Note that the threshold voltage distributions for page 8 are shifted to the left of the final distributions (shown as dashed line in FIG. 9B) at this time.

FIG. 9C shows actual threshold voltage distributions immediately after programming a subsequent page. This may be a page that is programmed on neighboring bit lines. For example, page 8 may have been programmed on even bit lines, and page 9 on even bit lines (both on the same word line). However, note that pages 10, 11, 12 etc. have not yet been programmed. Note that although the threshold voltage distributions for page 8 are still shifted to the left of the final distributions (shown as dashed line in FIG. 9C), they are closer to the final distributions. That is, the threshold voltage distributions of page 8 have moved to the right due to programming page 9.

FIG. 9D shows actual threshold voltage distributions immediately after programming a page that is still later in the sequence. This later page may be a page that is programmed on the neighboring word line. For example, referring back to FIG. 8C, page 12 corresponds to the even bit lines on WL(n+1). Therefore, programming page 12 after page 8 means that memory cells on the neighboring word line have been programmed. Note that pages 13, 18, 15 etc. are not necessarily programmed yet. In this case, the threshold voltage distributions for page 8 may still be shifted to the left of the final distributions (shown as dashed line in FIG. 9D). However, the threshold voltage distributions of page 8 have moved to the right relative to FIG. 9C. That is, the threshold voltage distributions of page 8 have moved to the right as a result of programming page 12. Also note that programming of pages 10 and 11 may also impact the threshold voltage distributions of page 8.

One possible reason for the shift in threshold voltage distributions is floating gate to floating gate coupling. Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are diagonal from the target floating gate because they are on both a neighboring bit line and neighboring word line.

The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

Embodiments disclosed herein compensate for partially programmed blocks. In one embodiment, the read levels are adjusted based on which pages that follow the target page have been programmed/not programmed. For example, when all pages in the block have been programmed, the read levels (Vra, Vrb, Vrc) depicted in FIG. 9A may be used. If none of the pages after the target page have been programmed, the read levels (Vra', Vrb', Vrc') depicted in FIG. 9B may be used.

Note that the examples for FIGS. 9A-9D correspond to the example programming sequence of FIG. 8C. Thus, stated another way, FIG. 9B covers the case in which neither neighboring memory cells on the same word line nor neighboring memory cells on the same bit line are not programmed.

If neighboring memory cells on the same word line have been programmed but neighboring memory cells on the same bit line are not programmed, then the read levels (Vra", Vrb", Vrc") depicted in FIG. 9C may be used.

If neighboring memory cells on the same word line have been programmed and neighboring memory cells on the same bit line are programmed, then the read levels (Vra''', Vrb''', Vrc''') depicted in FIG. 9D may be used. Note that since these read levels are quite close to the final read levels of FIG. 9A, it may be adequate to simply use the read levels from FIG. 9A. However, note that the programming of page 13 could have some effect on the threshold distributions of page 8. Referring back to FIG. 8C, page 13 corresponds to the odd bits line on WL(n+1). Note that there could be some diagonal floating gate to floating gate coupling effect on page 8 due to the programming of page 18. Depending on factors such as the size, shape, and materials, the diagonal floating gate to floating gate coupling effect could be significant enough to warrant using read levels (Vra''', Vrb''', Vrc''') instead of (Vra, Vrb, Vrc).

Note that using different read levels compensates for shifts in the threshold voltage distributions. Next, note that the programming sequence of FIG. 8C is just one example. In other embodiments, all bit line programming is used. FIG. 8B is a table that depicts a programming sequence for one embodiment that uses all bit line programming. In this embodiment, a lower page and upper page is programmed on each word line.

Figure 10:
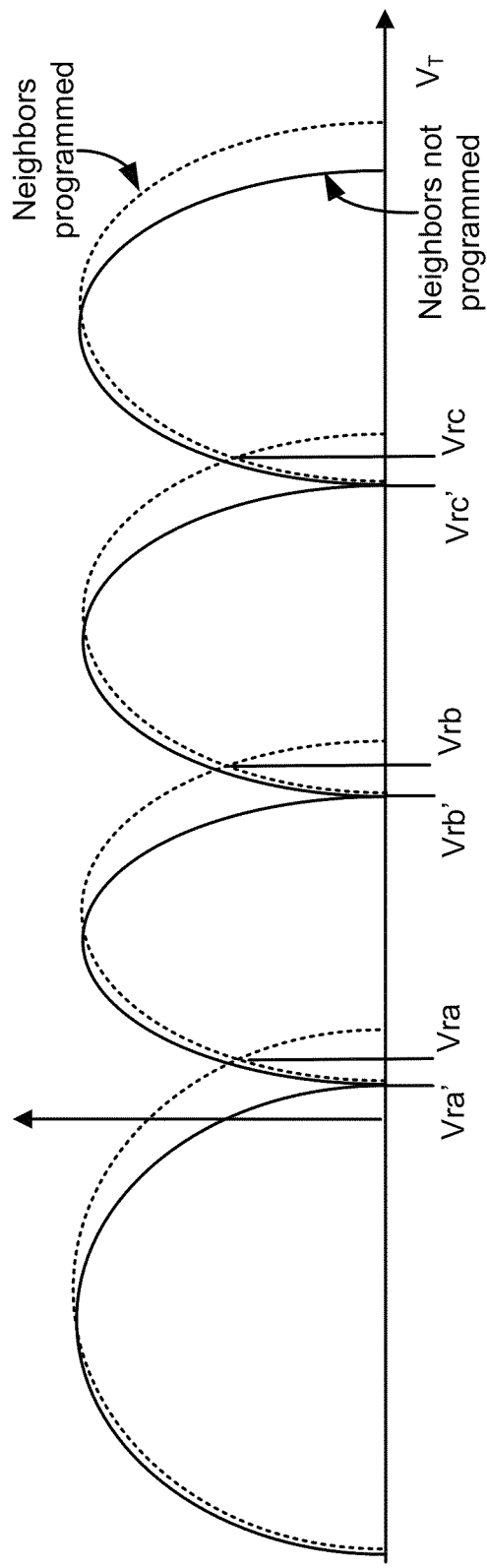
FIG. 10 shows another example of threshold voltage distributions for a given page.

FIG. 10 shows another example of threshold voltage distributions for a given page. For the sake of discussion, the page will be referred to as an even upper page. Referring to the example of FIG. 8C, this may be page 8. Note that page 8 corresponds to memory cells that are associated with even bit lines. Since this is an upper page, programming of these memory cells is complete.

The solid lines in FIG. 10 represent the threshold voltage distributions when the memory cells on the same word line but neighboring bit lines are not programmed. The dashed lines in FIG. 10 represent the threshold voltage distributions when the memory cells on the same word line but neighboring bit lines are programmed. For example, this may be the case if page 8 is programmed, but page 9 is not yet programmed.

In this example, after the neighbors have been programmed, there is some overlap of the threshold voltage distributions. Suitable read levels when the neighbors are programmed may be at or near the intersection of the threshold voltage distributions (e.g., Vra, Vrb, Vrc). That is, this point may provide for the greatest read margins.

Suitable read levels for the distributions prior to the neighbors being programmed may be arrived at in a similar manner. That is, suitable read levels can be chosen to provide for the greatest read margins. In this case, read levels (Vra', Vrb', Vrc') may provide the greatest read margins. Note that if the normal read levels were used instead there may be too many errors to correct. In some cases, the read may actually fail. Thus, by proactively using different read levels for partially programmed blocks, read errors may be avoided.

Figure 11:
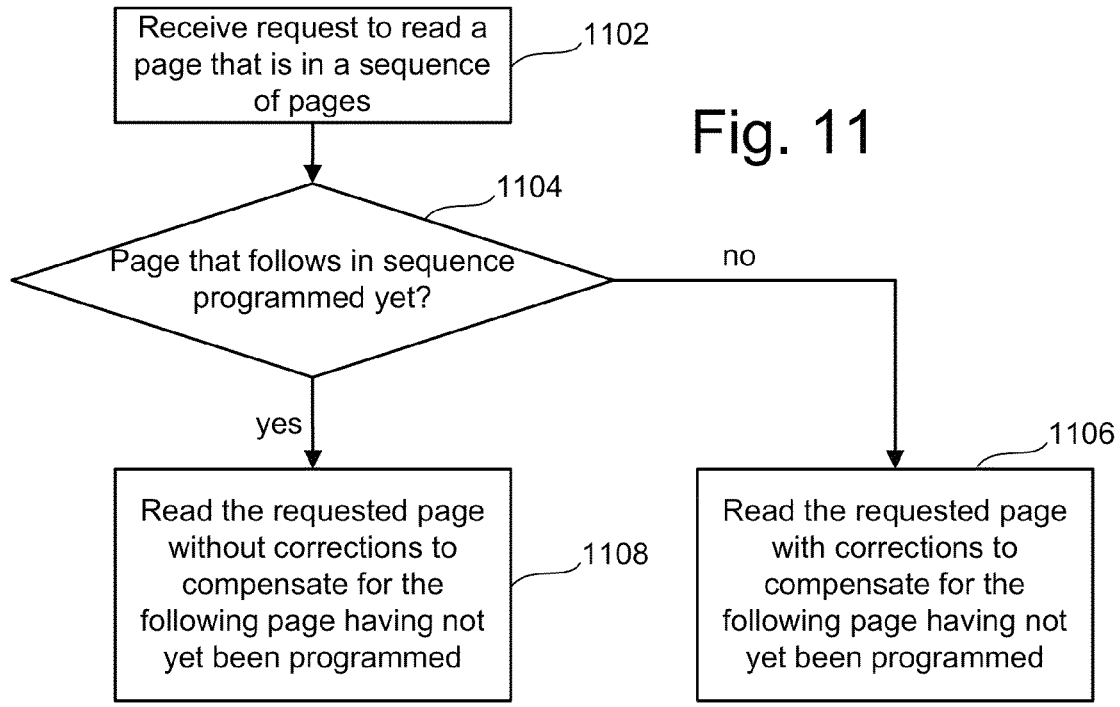
FIG. 11 is a flowchart of one embodiment of a process of reading non-voltage storage to compensate for partially programmed blocks.

FIG. 11 is a flowchart of one embodiment of a process of providing read compensation for partially programmed blocks of non-volatile storage cells. Prior to reading, one or more pages may have been programmed in the block. The pages may have been programmed in a particular sequence. That is, certain memory cells may be designated to store each page. Thus, groups of memory cells may be programmed in a certain order. In some embodiments, programming each successive page may cause additional interference with the target page to be read. The tables of FIGS. 8B and 8C depict two example page programming sequences. However, the process of FIG. 11 is not limited to these examples. Other possible page programming sequences include, but are not limited to, the examples depicted in FIGS. 18A-18E. Note that this process applies for all bit line programming, as well as even/odd bit line programming.

In step 1102, a request is received to read a page. This page is one page in a sequence of pages that either are stored or are to be stored in the block. Referring to FIG. 8C, as one example, this could be an even page or an odd page. That is, the memory cells could be associated with either even bit lines or odd bit lines. Also, the page could be an upper page or a lower page. Referring to FIG. 8B as another example, the page might be stored on all bit lines (both even and odd). The page might also be one from any of the tables in FIGS. 18A-18E, or some other page programming sequence.

In step 1104, a determination is made whether a page that follows the target page in the programming sequence has been programmed yet. Note that a following page is not limited to one that directly follows. Also note that step 1104 may test for a specific page. For example, if the target page is page m, then step 1104 might determine whether page m+1, m+2, m+3, m+4, m+5, etc. has been programmed yet. In one embodiment, a determination is made whether memory cells on a neighboring word line have been programmed yet. If page 8 from FIG. 8C is the target page, a determination may be made whether page 12 has been programmed yet. In one embodiment, a determination is made whether memory cells on a neighboring bit line have been programmed yet. For example, a determination may be made whether page 9 has been programmed yet in the present example. Note that this example of the target page being page 8 from FIG. 8C will continue to be used in the discussion of FIG. 11.

Step 1104 might also test for programming of a page that is diagonal to the target page. For example, page 13 in FIG. 8C may be considered diagonal to page 8, as follows. Page 8 is even bit lines on WL1, whereas page 13 is on odd bit lines of WL2. Therefore, there may be some diagonal floating gate to floating gate coupling between memory cells that store page 8 and memory cells that store page 13. Note that step 1104 could test for programming of a page that has some other relationship to the target page.

In one embodiment, step 1104 determines whether one or more pages that cause a threshold amount of interference have not yet been programmed. For example, pages 9 and 12 may cause a threshold amount of interference with page 8 if they were programmed. This interference may be due, at least in part, to floating gate to floating gate coupling. Other pages, such as page 15 may not cause a threshold amount of interference with page 8. Therefore, even if page 15 is not yet programmed (but page 12 is programmed), this may be ignored (if page 8 is the target page), for some embodiments.

Step 1106 is performed if the following page has not yet been programmed. In step 1106, the target page is read with corrections to compensate for the following page having not been programmed yet. For example, if page 12 has not yet been programmed, then read levels such as depicted in FIG. 9C might be used. Note that this may compensate for the lack of floating gate to floating gate coupling from memory cells on the neighboring word line.

On the other have, if page 9 has not been programmed, then read levels such as depicted in FIG. 9B might be used. Note that this implies that page 12 has not yet been programmed. In this case, step 1006 may compensate for the lack of floating gate to floating gate coupling from memory cells on the neighboring bit line (e.g., page 9), as well as the lack of floating gate to floating gate coupling from memory cells on the neighboring word line (e.g., page 12).

Note that the read corrections of step 1106 may be a function of how much interference is caused by programming of later pages in the sequence. Stated another way, the read corrections of step 1106 may be a function of how much interference would be caused if later pages in the sequence were programmed. Thus, step 1106 may compensate for this lack of interference with the target page. In one embodiment, step 1106 includes determining read levels for reading the target page based on whether at least one page that follow the target page in the page programming sequence and that causes a threshold amount of interference have not yet been programmed.

Step 1108 is performed if the following page has been programmed. In step 1108, the target page is read without any corrections to compensate for the following page not having been programmed yet. However, note that compensations made be made for effects other than partial block programming. For example, if the memory cells on the neighboring word line are programmed, then the actual data programmed into a neighbor may be used for compensation. Note this is a different type of compensation than is performed in step 1106. In step 1108, different target memory cells may receive a different amount of compensation (depending on the data stored in their neighbor). Further details of providing compensation based on the actual data stored in a neighboring memory cell are described in U.S. Pat. No. 7,499,319, titled "Read Operation for Non-Volatile Storage with Compensation for Coupling, to Mokhlesi, filed on Mar. 17, 2006, which is hereby incorporated by reference. The compensation provided in step 1108 may be referred to herein as "data dependent compensation."

In step 1106, the compensation is performed to compensate for memory cells having not yet been programmed. Therefore, there is no data in the neighboring memory cells. Thus, step 1106 may include applying the same read corrections to all non-volatile storage elements in the target group. Also note that step 1106 may compensate for the shifts in threshold voltage distributions that would occur due to later programming of pages.

Figure 12:
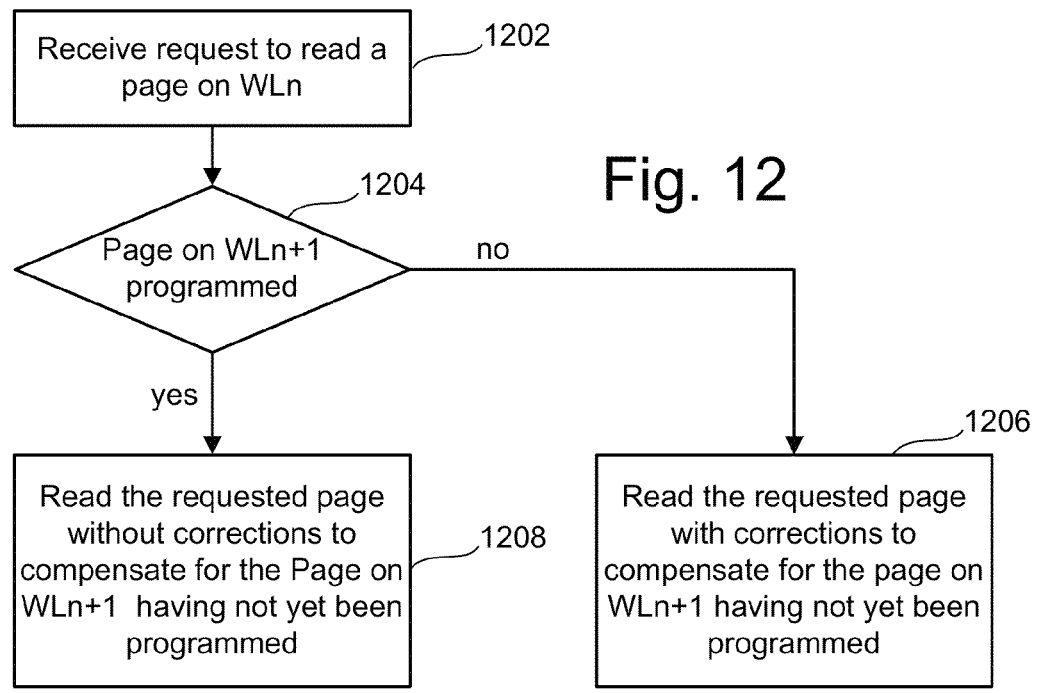
FIG. 12 is a flowchart of one embodiment of a process of reading non-volatile storage to compensate for a partially programmed block.

FIG. 12 is a flowchart of one embodiment of a process of reading non-volatile storage to compensate for a partially programmed block. In the process of FIG. 12, compensation is made for non-volatile storage elements on a neighboring word line having not yet been programmed. However, no compensation is made for non-volatile storage elements on a neighboring bit line having not yet been programmed. Note that the process may be used with even/odd bit line programming or with all bit line programming. Also note that the process of FIG. 12 is one embodiment of the process of FIG. 11.

In step 1202, a request is received to read a page on WLn. As one example, the requested page is page 4 from FIG. 8B. As another example, the requested page is page 8 from FIG. 8C.

In step 1204, a determination is made whether a page on WLn+1 has been programmed. Note that WLn+1 is a neighbor to WLn. In this example, WLn+1 is programmed after WLn. If, however, word lines are programmed in the other direction, then step 1204 may test for WLn−1. As one example, the page is page 6 from FIG. 8B. As another example, the page is either page 12 or 13 from FIG. 8C. In one embodiment, if the target page is associated with even bit lines then step 1204 tests whether a page that is associated with even bit lines and a neighboring word line is programmed. On the other hand, if the target page is associated with odd bit lines then step 1204 tests whether a page that is associated with odd bit lines and a neighboring word line is programmed.

If the page on WLn+1 has not yet been programmed, then step 1206 is performed. In step 1206, the page on WLn is read with compensation for the fact that the page on WLn+1 has not yet been programmed. For example, read compensation for a partially programmed block is provided. Note that step 1206 is one embodiment of step 1106 of FIG. 11.

If WLn+1 has been programmed, then step 1208 is performed. In step 1208, no compensation is needed to account for the page on WLn+1 having not yet been programmed. However, compensation could be used to account for the actual data stored in the page on WLn+1. For example, "data dependent compensation" may be provided. Note that step 1208 is one embodiment of step 1108 of FIG. 11.

Note that reading a page on WLn+1 may normally be performed when WLn is the target memory cell in order to provide data dependent compensation based on the state of the neighbor memory cells. Therefore, note that step 1204 of reading the page on WLn+1 does not add any extra overhead when data dependent compensation is used, in some embodiments.

Figure 13A:
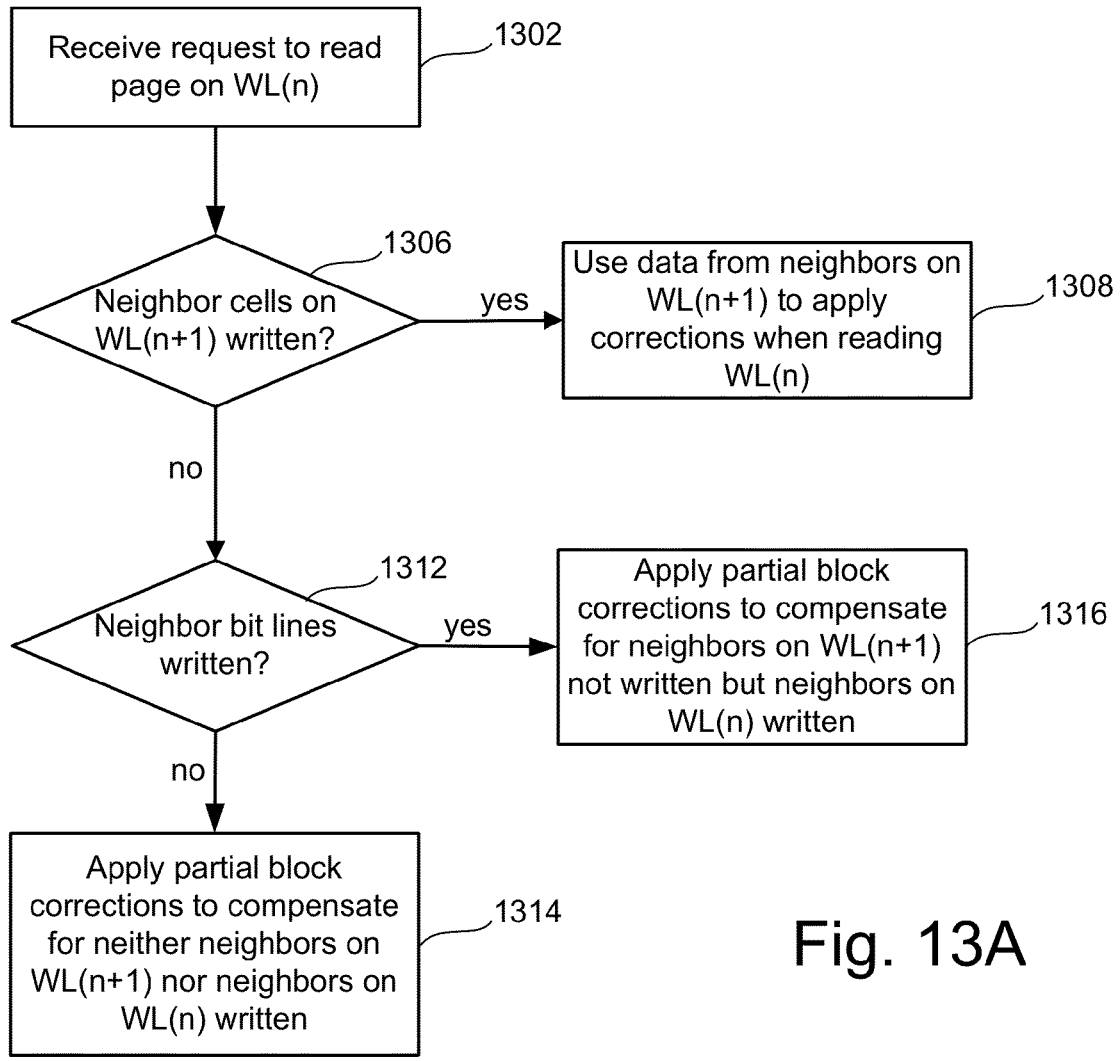
FIG. 13A is a flowchart of one embodiment of a process of reading non-volatile storage to compensate for a partially programmed block.

FIG. 13A is a flowchart of one embodiment of a process of reading non-volatile storage to compensate for a partially programmed block. In the process of FIG. 13A, compensation is made based on whether non-volatile storage elements on a neighboring word line have been programmed, and also whether non-volatile storage elements on neighboring bit lines have been programmed. Note that the process may be used with even/odd bit line programming. Also note that the process of FIG. 13A is one embodiment of the process of FIG. 11.

In step 1302, a request is received to read a page of data on WLn. As one example, the page may be one that is programmed into non-volatile storage elements associated with even bit lines. As another example, the page may be one that is programmed into non-volatile storage elements associated with odd bit lines. For the sake of discussion, an example in which the requested page is page 8 from FIG. 8C will be used. Note that although in the example of FIG. 8C that even bit lines are programmed prior to odd bit lines, the odd bit lines could be programmed prior to the even bit lines.

In step 1306, a determination is made whether the neighbor memory cells on WLn+1 have been programmed yet. Note that if the page on WLn is associated with even bit lines, then only the memory cells associated with even bit lines need to be tested in step 1306. For example, step 1306 may determine whether page 12 has been programmed (referring to FIG. 8C). Likewise, if the page on WLn is associated with odd bit lines, then only the memory cells associated with odd bit lines need to be tested in step 1306. Also note that step 1306 does not need to actually test the memory cells directly. As further described below, other techniques such as tracking the last page that was programmed may be used.

If WLn+1 has been programmed, then step 1308 is performed. In step 1308, data dependent compensation is used when reading the page on WLn. However, read compensation for a partially programmed block is not used. Note that step 1308 is one embodiment of step 1108 of FIG. 11. In other embodiments, data dependent compensation is not used when reading WLn.

If the memory cells on WLn+1 have been programmed, then additional steps are taken to determine whether memory cells on neighboring bit lines have been programmed yet, in step 1312. Note that the neighboring bit lines may alternate with the bit lines of the memory cells for the target page. For example, step 1312 may determine whether page 9 has been programmed (referring to FIG. 8C).

If step 1312 determines that the memory cells associated with neighboring bit lines (and the same word line) have not been written, the step 1314 is performed. In step 1314, the target page is read while applying partial block corrections to compensate for neither the memory cells on the neighboring word line nor the memory cells on the neighboring bit lines being written. Thus, a first set of read corrections (e.g., Vra', Vrb', Vrc' in FIG. 9B) may be used in this case. Note that step 1314 is one embodiment of step 1106 from FIG. 11.

If step 1312 determines that the memory cells associated with neighboring bit lines (and the same word line) have been written, the step 1316 is performed. In step 1316, the target page is read while applying partial block corrections to compensate for the memory cells on the neighboring word line having not been written. However, since the memory cells on the neighboring bit lines have been written, no compensation is needed for this. Thus, a second set of read corrections (e.g., Vra", Vrb", Vrc" in FIG. 9C) may be used in this case. Note that step 1306 is one embodiment of step 1106 from FIG. 11.

Figure 13B:
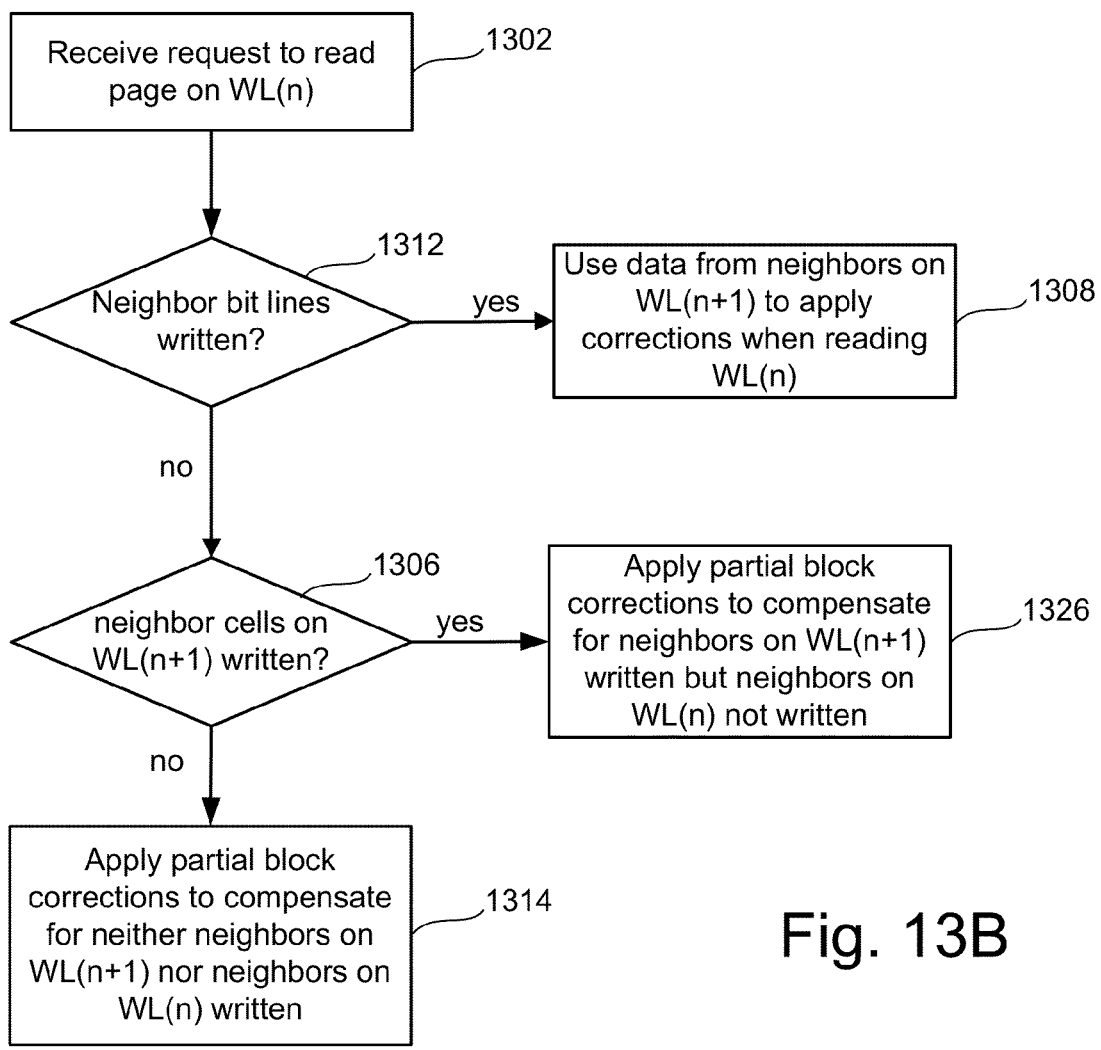
FIG. 13B is a flowchart of one embodiment of a process of reading non-volatile storage to compensate for a partially programmed block.

In FIG. 13A, the page programming sequence programs the memory cells on the neighboring bit lines prior to the memory cells on the neighboring word line. For example, page 9 is programmed prior to page 12 (see, for example, FIG. 8C). However, a different page programming sequence could be used. As one example, the memory cells on the neighboring bit lines could be programmed after the memory cells on the neighboring word line. For example, the table of FIG. 8C might be altered such that pages 9 and 12 are swapped. For example, page 9 may be programmed into memory cells on WL2 and page 12 may be programmed into memory cells on WL1. In such as case, after programming page 8 on even bit lines of WL1, page 9 is programmed on even bit lines of WL2. Later page 12 is programmed on odd bit lines of WL1. In this case, the process of FIG. 13B may be used. Note that FIG. 13B is similar to FIG. 13A. However, steps 1306 and 1312 are switched. Also, in step 1326 the partial block compensations are different that for FIG. 13A. In step 1326, the partial block compensations compensate for the memory cells on the neighboring bit lines having not been written, but the memory cells on the neighboring word lines having been written.

In some embodiments, a counter is kept of which pages have been programmed in a block. This counter may be stored in either volatile storage or non-volatile storage. The counter may be either on the memory die 598 or off the memory die 598 that contains the block. As one example, the controller 550 may store the counter off the memory die 598. As another example, the counter may be stored in non-volatile storage elements in the memory array 400. The counter could also be located elsewhere on the memory die 598 than the memory array 400. For example, the counter may be located in the control circuitry 510. In this case, the counter might be formed from data latches or a register. Note that in many cases in which a block is only partially programmed, requests to read a page in the partially programmed block may occur while the memory device remains powered on. Thus, even storing the counter in volatile memory can be useful.

Figure 14A:
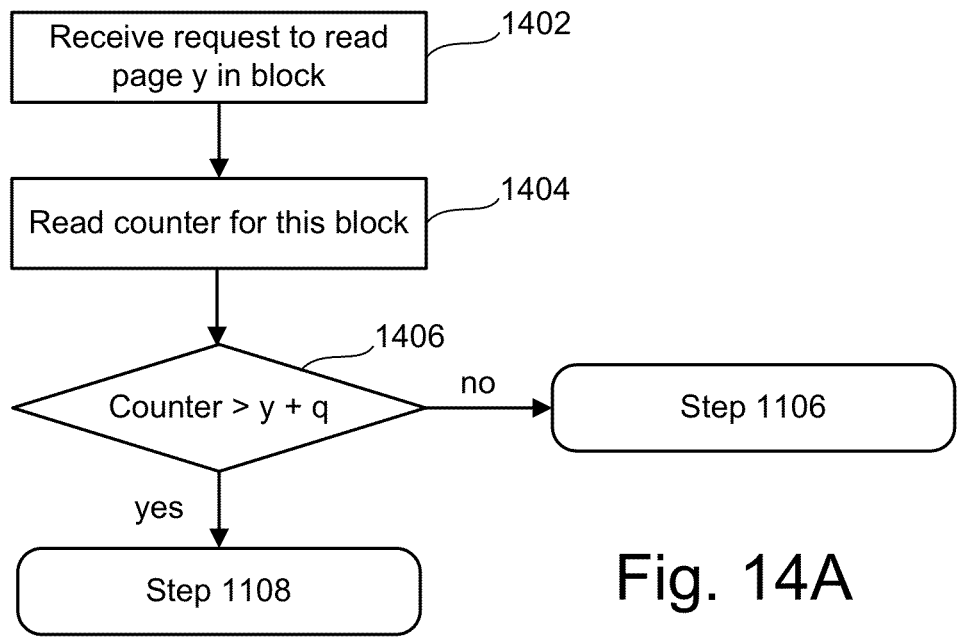
FIG. 14A is a flowchart of one embodiment of a process for determining whether a page that follows that target page has been programmed.

FIG. 14A is a flowchart of one embodiment of a process for determining whether a page that follows that target page has been programmed. In this embodiment, a counter that indicates the last page that was programmed into the block is accessed. In step 1402, a request to read a page in a block is received.

In step 1404, the counter for the block is read. Examples of counters have previously been discussed.

In step 1406, a determination is made whether the counter is greater than some amount that would indicate that compensation is not needed. Step 1406 may determine whether some specific page that follows the target page has been programmed yet. For example, if the target page is page 8, then step 1406 may determine whether page 12 has been programmed yet. As another example, if the target page is page 8, then step 1406 may determine whether page 9 has been programmed yet. Note that steps 1404-1406 may be considered to be one embodiment of step 1104 from FIG. 11. These steps may also be used for step 1204, 1306, or 1312.

Next, either step 1106 and 1108 may be performed, depending on whether compensation is desired for the unprogrammed page. Alternatively, one of steps 1206, 1314, 1316, or 1326 might be performed if read compensation for a partially programmed block is desired. Alternatively, one of steps 1208 or 1308 might be performed if read compensation for a partially programmed block is not desired.

In some embodiments, a flag is kept of whether the entire block has been programmed. In the event that the entire block has been programmed, then time may be saved by not having to determine whether certain pages have been programmed. If the flag indicates that the block is only partially programmed, then partial block compensation may or may not be needed, depending on which pages have not yet been programmed. The flag may be stored in either volatile storage or non-volatile storage. However, it may be more useful to store the flag in non-volatile storage.

Figure 14B:
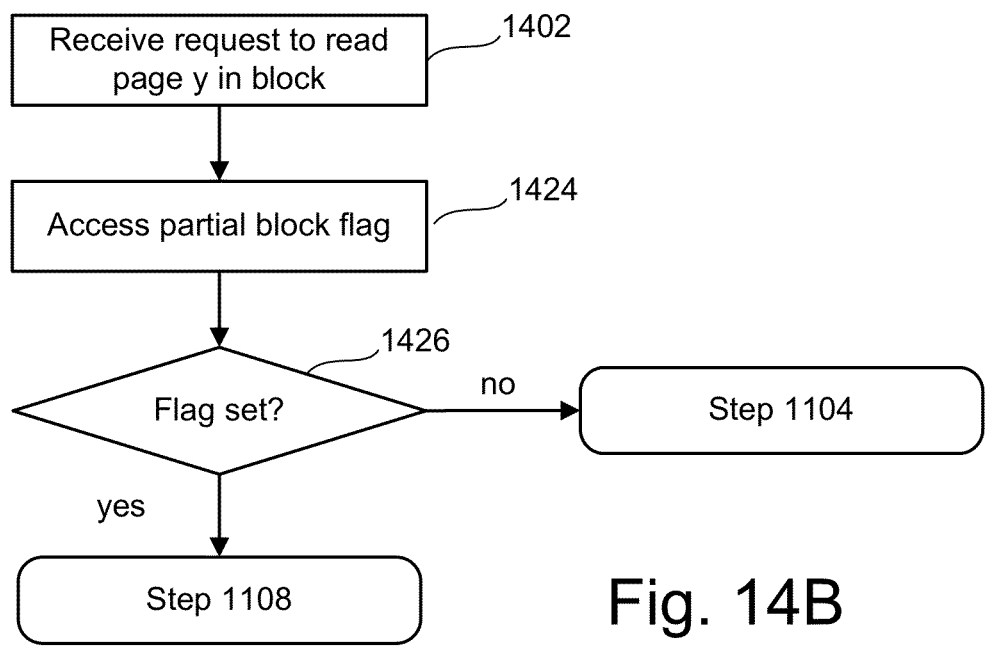
FIG. 14B is a flowchart of one embodiment of a process for determining whether a page that follows that target page has been programmed.

FIG. 14B is a flowchart of one embodiment of a process for determining whether a page that follows that target page has been programmed. In this embodiment, a flag that indicates the entire block has been programmed is accessed. In step 1402, a request to read a page in a block is received.

In step 1424, the flag for the block is read.

In step 1426, a determination is made whether the flag is set. If the flag is set, this indicates that the block is fully programmed. Therefore, no compensation needs to be used for a partially programmed block. Therefore, step 1108 is performed (reading without partial block compensation). If desired, data dependent compensation may be used.

If the flag is not set, this indicates that the block is only partially programmed. However, it is still not known which pages have not been programmed. Therefore, compensation may or may not be needed for a partially programmed block. Therefore, step 1104 may be performed to determine whether a page that follows the target page has been programmed. Note that instead of performing step 1104, step 1204 from FIG. 12, step 1306 from FIG. 13A, or step 1312 from FIG. 13B may be performed.

In one embodiment, the determination of whether a following page has been programmed is made based on reading of threshold voltages of memory cells. For example, referring to FIG. 7C, if both the lower page and upper page have been programmed in a group of memory cells, then at least some of the memory cells should have a threshold voltage of at least the C-state. On the other hand, if only the lower page has been programmed, then the highest threshold voltage for the group should be the LM state.

Figure 15A:
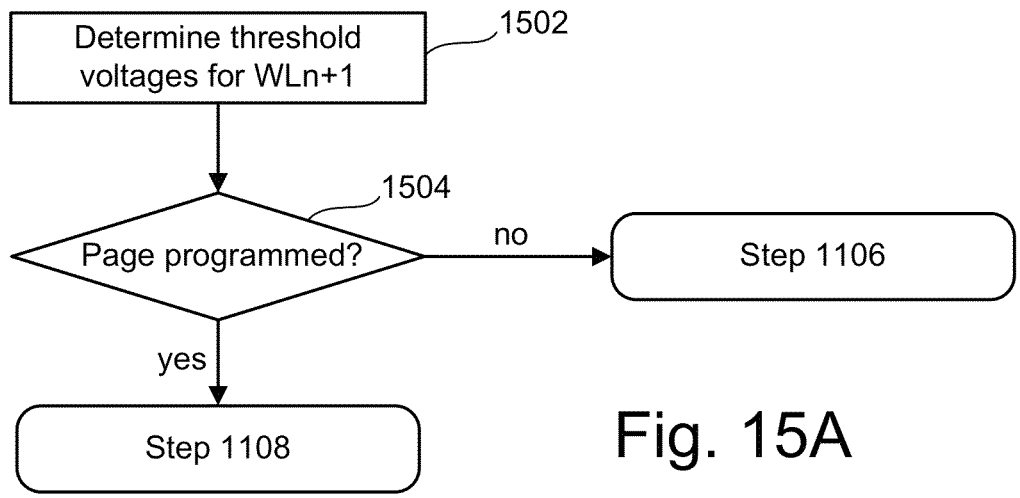
FIG. 15A is a flowchart of one embodiment of a process of reading threshold voltages to determine whether a page has been programmed.

FIG. 15A is a flowchart of one embodiment of a process of reading threshold voltages to determine whether a page has been programmed. The process is one embodiment of step 1104. The process may also be used for step 1204, step 1306, or step 1312. Therefore, it will be assumed that a request to read a page on WLn has been received.

In step 1502, threshold voltages of memory cells on WLn+1 is determined. Note that the page of interest may be programmed on either odd or even bit lines. Therefore, only memory cells associated with either odd or with even bit lines are read, in one embodiment. However, if the pages are programmed on all bit lines, then all memory cells on the word line might be read.

The following example will be used to help illustrate step 1502. Consider the case in which the memory cells hold upper and lower pages. If the page of interest is an upper page, then the memory cells on WLn+1 may be read at Vrc (see FIG. 7A). On the other hand if step 1502 is interested in a lower page, then the memory cells may be read at a level somewhat below VvLM (see FIG. 7B).

In step 1504 a determination is made whether the highest threshold voltage that was read indicates that the page is programmed. For example, if at least one memory cell has a threshold voltage above Vrc, then it may be assumed that the upper page was programmed.

Note that in some cases step 1504 tests whether at least a certain number of memory cells have a threshold voltage of at least certain level. This is because it may be possible for a few memory cells to have a threshold voltage that is higher than it should be. For example, when programming a memory cell to the LM state, that memory cell may have inadvertently over-programmed to the C-state. Note that error correction codes can be used to correct such an error. Therefore, if only a few memory cells are in the C-state during the test of step 1504, these may be ignored in some embodiments. Similar reasoning applies to testing for other threshold voltages in step 1504.

If step 1504 determines that at least a certain number of memory cells have a threshold voltage of at least certain level, this indicates that the page in question has been programmed. Thus, step 1108 may be performed.

If step 1504 determines that the page in question has not been programmed, then some partial block compensation should be used. Thus, step 1106 is performed.

In some embodiments, status is stored in non-volatile storage to indicate whether one or more pages have been programmed. For example, for embodiments that store a lower page and an upper page in the same group of memory cells, the status may be stored in one or more memory cells on the same word line as the pages. As noted above, in addition to the memory cells on the word line that store user data, there may be some memory cells that are used for overhead. The status may be stored in these overhead memory cells.

When performing a two-pass programming operation such as depicted in FIGS. 7B and 7C, the status can be set to indicate that the first programming pass has been completed (lower page is programmed). After completing the second pass, the status can be set to indicate that the second programming pass has been completed (upper page is programmed). In one embodiment, this status is read to determine whether a certain page is programmed.

Figure 15B:
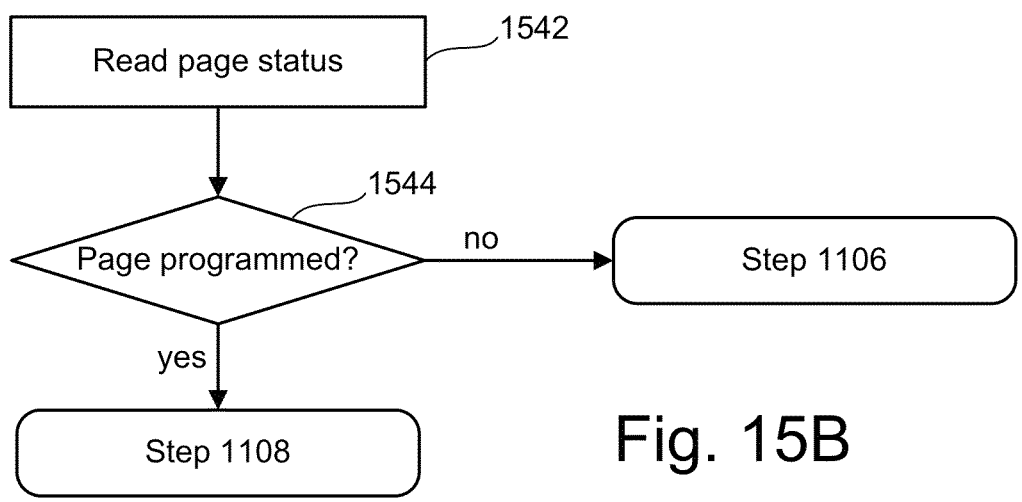
FIG. 15B is a flowchart of one embodiment of a process of reading page status to determine whether a certain page is programmed.

FIG. 15B is a flowchart of one embodiment of a process of reading page status to determine whether a certain page is programmed. In step 1542, page status is read. The following examples will be used to illustrate. Consider that all bit line programming is being used and the page to be tested is on WLn+1. Step 1542 reads memory cells that hold the page status for WLn+1. As another example, consider a case of even/odd bit line programming. A first scenario is where the target page is associated with even bit lines and WLn. Memory cells that hold page status for WLn+1 are read in this case. A second scenario is where the page is question is associated with odd bits lines and WLn. In this case, page status memory cells on WLn are read. Note that in one embodiment, the page status memory cells for odd bit lines can be read at the same time as page status memory cells for even bit lines (even if normally even and odd bit lines are read separately). Therefore, time may be saved by not having to read both even and odd bit lines, in some cases.

In step 1544, a determination is made whether a certain page has been programmed yet, based on the page status. Note that step 1544 may be used to implement steps 1104, 1204, 1306, or 1312.

If the page has not yet been programmed, then step 1106 may be performed. Alternatively, one of steps 1206, 1314, 1316, or 1326 might be performed.

If the page has been programmed, then step 1108 may be performed. Alternatively, one of steps 1208 or 1308 might be performed.

Figure 16:
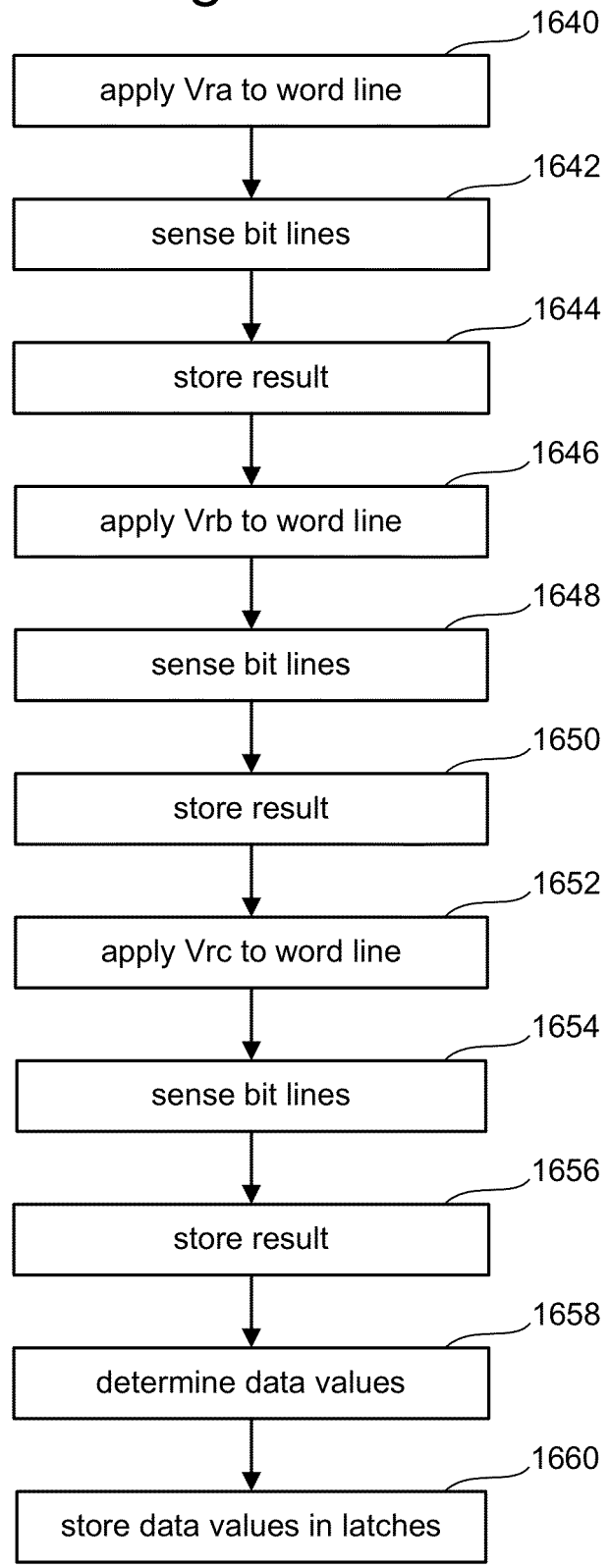
FIG. 16 is a flow chart describing one embodiment of a process for performing a read operation for a page.

FIG. 16 is a flow chart describing one embodiment of a process for performing a read operation for a page. The process may be used to perform step 1108 from FIG. 11. Also, the process may be used for steps 1208 or 1308. Note that simply by changing the read levels, the process may be used to perform step 1106 of FIG. 11 to provide read compensation for a partially programmed block. Also, the process may be used for steps 1206, 1314, 1316, or 1326 by changing the read levels. Also note that read compensation for a partially programmed block may be achieved with other techniques besides changing read levels, as is described more fully below.

The process of FIG. 16 can be performed for a page that encompasses all bit lines of a block, only odd bit lines of a block, only even bit lines of a block, or other subsets of bit lines of a block. In step 1640, read reference voltage Vra is applied to the appropriate word line associated with the target page. In step 1642, the bit lines associated with the page are sensed to determine whether the addressed memory cells turn on or do not turn on based on the application of Vra to their control gates. Bit lines that conduct indicate that the memory cells were turned on; therefore, the threshold voltages of those memory cells are below Vra (e.g., in state E). In step 1644 the result of the sensing for the bit lines is stored in the appropriate latches for those bit lines. In step 1646, read reference voltage Vrb is applied to the word lines associated with the page being read. In step 1648, the bit lines are sensed as described above. In step 1650, the results are stored in the appropriate latches for the bit lines. In step 1652, read reference voltage Vrc is applied to the word lines associated with the page. In step 1654, the bit lines are sensed to determine which memory cells turn on, as described above. In step 1656, the results from the sensing step are stored in the appropriate latches for the bit lines. In step 1658, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In other embodiments, sensing the various levels (Vra, Vrb, and Vrc) may occur in different orders.

In one embodiment, the partial block compensation is performed by applying different voltages to the selected word line than the normal levels used in the process of FIG. 16. For example, referring to FIG. 9B, the levels Vra', Vrb', Vrc' may be applied to the selected word line. Recall that FIG. 9B describes the case in which neither memory cells that are on neighboring bit lines, nor memory cells that are on the neighboring word line are programmed. As another example, referring to FIG. 9C, the levels Vra", Vrb'", Vrc" may be applied to the selected word line. Recall that FIG. 9C describes the case in which memory cells that are on neighboring bit lines have been programmed, but memory cells that are on the neighboring word line are not yet programmed. Other read levels can be used for other cases.

Note that there are other ways to perform the read compensations for partially programmed blocks. In one embodiment, a different voltage than normal is applied to one or more of the unselected word lines. Prior to describing such compensation, further details of embodiments of timing signals used when reading memory cells will be described.

Figure 17:
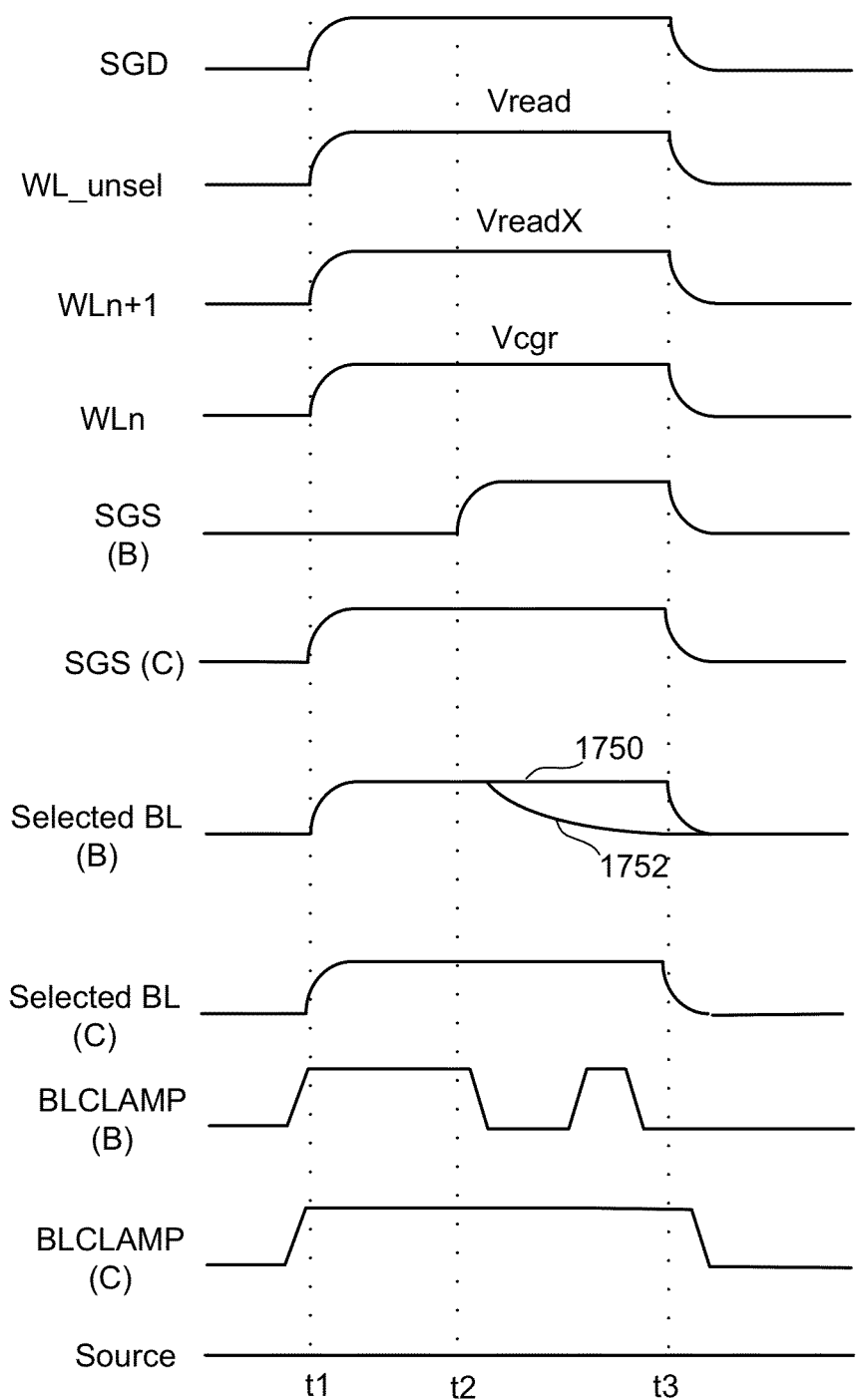
FIG. 17 is a timing diagram depicting the behavior of various signals during one iteration of a read or verify process.

FIG. 17 is a timing diagram depicting the behavior of various signals during one iteration of a read or verify process. If the memory cells are multi-state memory cells with four states (e.g., E, A, B, and C), the process of FIG. 17 may be performed for step 1640, step 1646, and step 1652 of FIG. 16.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In one embodiment, a memory array that uses all bit line programming can measure the conduction current of a memory cell by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not. In one embodiment, a memory array that uses odd/even programming can measure the conduction current of a memory cell by determining whether the bit line has discharged. FIG. 17 explains both examples.

FIG. 17 shows signals SGD, WL_unsel. WLn+1, WLn, SGS, Selected BL, BLCLAMP, and Source starting at Vss (approximately 0 volts). SGD represents the gate of the drain side select gate. SGS is the gate of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells. BLCLAMP is an analog signal that sets the value of the bit line when charged from the sense amplifier. Note that there are two versions of SGS, Selected BL and BLCLAMP depicted in FIG. 17. One set of these signals SGS (B), Selected BL (B) and BLCLAMP (B) depicts a read/verify operation for an array of memory cells that measure the conduction current of a memory cell by determining whether the bit line has discharged. Another set of these signals SGS (C), Selected BL (C) and BLCLAMP (C) depicts a read/verify operation for an array of memory cells that measure the conduction current of a memory cell by the rate it discharges a dedicated capacitor in the sense amplifier.

First, the behavior of the sensing circuits and the array of memory cells that are involved in measuring the conduction current of a memory cell by determining whether the bit line has discharged will be discussed with respect to SGS (B), Selected BL (B), and BLCLAMP (B). At time t1 of FIG. 17, SGD is raised to Vdd (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIG. 7A or 9A) for a read operation, and BLCLAMP (B) is raised to a pre-charging voltage to pre-charge the selected bit line Selected BL(B) (e.g., to approximately 0.7 volts). The voltages Vread and VreadX act as pass voltages because they cause the unselected memory cells to turn on and act as pass gates. At time t2, BLCLAMP (B) is lowered to Vss so the NAND string can control the bit line. Also at time t2, the source side select gate is turned on by raising SGS (B) to Vdd. This provides a path to dissipate the charge on the bit line. If the threshold voltage of the memory cell selected for reading is greater than Vcgr or the verify level applied to the selected word line WLn, then the selected memory cell will not turn on and the bit line will not discharge, as depicted by signal line 1750. If the threshold voltage in the memory cell selected for reading is below Vcgr or below the verify level applied to the selected word line WLn, then the memory cell selected for reading will turn on (conduct) and the bit line voltage will dissipate, as depicted by curve 1752. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered, as depicted in FIG. 17. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it discharges a dedicated capacitor in the sense amplifier will be discussed with respect to SGS (C), Selected BL (C) and BLCLAMP (C). At time t1 of FIG. 17, SGD is raised to Vdd (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIG. 7A or 9A) for a read operation, and BLCLAMP (C) is raised. In this case, the sense amplifier holds the bit line voltage constant regardless of what the NAND sting is doing, so the sense amplifier measures the current flowing with the bit line "clamped" to that voltage. Therefore, BLCLAMP (C) rises at t1 and does not change from t1 to t3. At some point after time t1 and prior to time t3 (as determined by the particular implementation), the sense amplifier will determine whether the capacitor in the sense amplifier has dissipated a sufficient amount. At time t3, the depicted signals will be lowered to Vss (or another value for standby or recovery). Note that in other embodiments, the timing of some of the signals can be changed.

As discussed herein, partial block read compensation is provided by various embodiments. One embodiment also includes setting up, during the verification process, the required conditions for the later application of partial block read compensation. In such an embodiment the overdrive/bypass voltage, otherwise known as VREAD, applied to WLn+1 is reduced from a typical value of, for example, 6V down to, for example, 3V. The compensation will consist of application of higher voltage, as compared to that voltage that was used during the verify phase of program/verify operations, to WLn+1 during the read operation performed on WLn. In other words the compensation consists of a change/delta: $\Delta VREAD=\{[VREAD(WLn+1 \text{ during read of } WLn)]-[VREAD(WLn+1 \text{ during verify of } WLn)]\}$. The advantage of using a lower VREAD value during verify is that it allows the application of nominal values of VREAD later during read operations, while maintaining the required $\Delta VREAD$. Had it not been for the use of a smaller than nominal value of VREAD during verify, the necessary value of VREAD during read that would allow the application of sufficient $\Delta VREAD$ would have been, for example, 6+3=9V which would have been too high a voltage as such high VREAD voltage lead to read disturb conditions. One example of such setting up for later compensation is depicted in FIG. 17 as the application of VreadX to the drain side neighboring word line while the other unselected word lines receive Vread. In the embodiment of FIG. 17, all of the unselected word lines, except for the drain side neighbor, receive Vread; while the drain side neighbor receives VreadX.

Thus, in one embodiment, when performing steps 1640-1644 of FIG. 16, the timing signals depicted in FIG. 17 are used, with Vcgr=Vra and VreadX=Vread. Note that even though the normal read level of Vra is used, partial block compensation is provided for. Similarly, when performing steps 1646-1650 of FIG. 16, the timing signals depicted in FIG. 17 are used, with Vcgr=Vrb and VreadX=Vread. Again, note that even though the normal read level of Vrb is used, partial block compensation is provided for. Likewise, when performing steps 1652-1656 of FIG. 16, the timing signals depicted in FIG. 17 are used, with Vcgr=Vrc and VreadX=Vread. Again, note that even though the normal read level of Vrc is used, partial block compensation is provided for.

In other embodiments, the partial block compensation is provided for by applying other than normal voltages to the selected bit lines, to the source line, or to the substrate. For example, if normally Vdd is applied to the selected bit lines, then Vdd+delta may be applied to provide the partial block compensation. As another example, if normally the common source line is grounded, then some small voltage (positive or negative) may be applied to the common source line to provide the partial block compensation. As still another example, if normally the substrate is grounded, then some voltage may be applied to the substrate to provide the partial block compensation.

In other embodiments, the partial block compensation is provided for by changing sensing factors. In one embodiment, the timing of sensing waveform is changed. As noted above, in some embodiments, a conduction current of the selected memory cell is analyzed to determine the threshold voltage. In one embodiment, the conduction current from the selected memory cell is used to charge or discharge a capacitor. The partial block compensation may be provided by changing the time for which the conduction current charges/discharges the capacitor. In one embodiment, the conduction current from the selected memory cell is used to discharge the selected bit line (which may have been pre-charged). The charging time may be modified to provide the partial block read compensation in this embodiment.

Note that many other techniques may be used to provide the partial block read compensation.

FIGS. 8B-8C showed two possible page programming sequences. Note that many other types of page programming sequences may be used. FIGS. 18A-18E depict tables of a few other page programming sequences that may be used when applying partial block compensation. Note that any of the following page programming sequences could be used in FIG. 11 or FIG. 12. The even/odd bit lines programming sequences could be used with FIG. 13A.

FIG. 18A is a table which describes the order for programming memory cells along a bit line for all bit line programming. In this embodiment, the block with four word lines includes four pages (page 0-3). Page 0 is written first, followed by page 1, followed by page 2 and then followed by page 3. The data in page 0 includes the data stored by all the memory cells connected to word line WL0. The data in page 1 includes the data stored by the memory cells connected to word line WL1. The data in page 2 includes the data stored by memory cells connected to WL2. The data in page 3 includes the data stored by memory cells connected to word line WL3. The embodiment of FIG. 18A assumes full sequence programming.

FIG. 18B depicts the order of programming during odd/even programming when using a full sequence programming method. In this embodiment, a block with four word lines includes eight pages of data. The memory cells on even bit lines connected to word line WL0 store data for page 0. Memory cells on odd bit lines connected to word line WL0 store data for page 1. Memory cells on even bit lines connected to word line WL1 store data for page 2. Memory cells on odd bit lines connected to word line WL1 store data for page 3. Memory cells on even bit lines connected to word line WL2 store data for page 4. Memory cells on odd bit lines connected to word line WL2 store data for page 5. Memory cells on even bit lines connected to word line WL3 store data for page 6. Memory cells on odd bit lines connected to word line WL3 store data for page 7. Data is programmed in numerical order according to page number, from page 0 to page 7.

The table of FIG. 18C describes the order for programming according to a two phase programming process such as in FIGS. 7A-7B in a memory array that performs all bit line programming. A block with four word lines is depicted to include eight pages. For memory cells connected to word line WL0, the lower page of data forms page 0 and the upper page data forms page 1. For memory cells connected to word line WL1, the lower page of data forms page 2 and the upper page data forms page 3. For memory cells connected to word line WL2, the lower page of data forms page 4 and the upper page data forms page 5. For memory cells connected to word line WL3, the lower page of data forms page 6 and the upper page data forms page 7. Data is programmed in numerical order according to page number, from page 0 to page 7.

FIG. 18D provides a table describing the order of programming a two-phase programming process such a FIGS. 7A-7B for a memory architecture that performs odd/even programming. A block with four word lines includes 16 pages, where the pages are programmed in numerical order according to page number, from page 0 to page 15. For memory cells on even bit lines connected to word line WL0, the lower page of data forms page 0 and the upper page data forms page 2. For memory cells on odd bit lines connected to word line WL0, the lower page of data forms page 1 and the upper page of data forms page 3. For memory cells on even bit lines connected to word line WL1, the lower page forms page 4 and the upper page forms page 6. For memory cells on odd bit lines connected to word line WL1, the lower page forms page 5 and the upper page forms page 7. For memory cells on even bit lines connected to word line WL2, the lower page forms page 8 and the upper page forms page 10. For memory cells on odd bit lines connected to word line WL2, the lower page forms page 9 and the upper page forms page 11. For memory cells on even bit lines connected to word line WL3, the lower page forms page 12 and the upper page forms page 18. For memory cells on odd bit lines connected to word line WL3, the lower page forms page 13 and the upper page forms page 15. Alternately, as in FIG. 18E, both lower and upper pages under each word line of the even bit lines are programmed before programming both pages of the odd bit lines for this same word line.

Note that the pages may include more than a lower and upper page. For example, there might be a lower-middle-, and upper-page. In other words, three bits may be stored per memory cell. Embodiments discussed herein may provide partial block read compensation for such schemes. As a further example, four bits may be stored per memory cell. In this case, there may be four pages in the page programming scheme. Embodiments discussed herein may provide partial block read compensation for such schemes that store four bits per memory cell. Embodiments discussed herein may provide partial block read compensation for schemes that store more than four bits per memory cell.

One embodiment includes a method of operating non-volatile storage. The method may provide read compensation for partially programmed blocks of non-volatile storage. In this embodiment, a request to read data for a first page is received. The first page is associated with a first group of non-volatile storage elements in a block of non-volatile storage elements. A determination is made whether a second page has been programmed yet. The second page follows the first page in a sequence in which pages are programmed. The second page is associated with a second group of non-volatile storage elements that are neighbors to the first group of non-volatile storage elements. Note that the second page does not necessarily directly follow the first page. Read corrections are applied to read the first page if the second page has not yet been programmed. The read corrections compensate for at least the second page having not yet been programmed.

One embodiment includes a method of operating non-volatile storage. The method may provide read compensation for partially programmed blocks of non-volatile storage. In this embodiment, a request is received to read data for a first page that is associated with a first group of non-volatile storage elements in a set of non-volatile storage elements. The first page is a first page of pages that are programmed in a sequence. Programming at least some of the successive pages in the sequence causes additional interference with the first page. A determination is made whether one or more pages that follow the first page in the sequence and that causes a threshold amount of interference have not yet been programmed. The one or more pages are associated with other non-volatile storage elements in the set. Read corrections are applied to read the first page if it is determined that at least one page in the sequence that causes at least the threshold amount of interference has not yet been programmed. The read corrections are a function of how much interference is caused to the first page by programming of later pages in the sequence.

One embodiment includes a method of operating non-volatile storage. A request is received to read data for a first page stored in a first group of non-volatile storage elements on a first word line and a first set of bit lines that alternates with a second set of bit lines. A determination is made whether at least one of a second page or a third page has not yet been programmed. A second group of non-volatile storage elements is for storing the second page; a third group of non-volatile storage elements is for storing the third page. The second group of non-volatile storage elements is on a second word line that neighbors the first word line; the third group of non-volatile storage elements is on the first word line and the second set of bit lines. Read corrections are applied to read the first page if at least one of the second page or the third page has not yet been programmed, the read corrections compensate for the second page and/or the third page having not yet been programmed.

One embodiment includes a non-volatile storage device comprising a block of non-volatile storage elements and one or more management circuits in communication with the block of non-volatile storage elements. The non-volatile storage elements include a first group of non-volatile storage elements and a second group of non-volatile storage elements that are neighbors to the first group of non-volatile storage elements. The first group of non-volatile storage elements are for storing a first page; the second group of non-volatile storage elements are for storing a second page. The second page follows the first page in a sequence in which pages are programmed. The one or management circuits receive a request to read the first page. The one or more management circuits determine whether the second page has been programmed yet. The one or more management circuits apply read corrections to read the first page if the second page has not yet been programmed. The read corrections compensate for at least the second page having not yet been programmed.

One embodiment includes a non-volatile storage device comprising a plurality of word lines, a plurality of bit lines, a set of non-volatile storage elements, and one or more management circuits in communication with the block of non-volatile storage elements. The plurality of word lines include a first word line and a second word line that neighbors the first word line. The plurality of bit lines include a first set of bit lines and a second set of bit lines that alternate with the first set of bit lines. The set of non-volatile storage elements includes a first group of non-volatile storage elements for storing a first page, a second group of non-volatile storage elements for storing a second page, and a third group of non-volatile storage elements for storing a third page. The first page is programmed before the second page and the third page in a page sequence. The first group of non-volatile storage elements are associated with the first word line and the first set of bit lines; the second group of non-volatile storage elements are associated with the second word line and with the first set of bit lines; the third group of non-volatile storage elements are associated with the first word line and the second set of bit lines. The one or management circuits receive a request to read the first page. The one or more management circuits determine whether the second page has been programmed yet. The one or more management circuits apply read corrections to read the first page if the second page has not yet been programmed. The read corrections compensate for at least the second page having not yet been programmed.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope be defined by the claims appended hereto.

We claim:

1. A method for operating non-volatile storage comprising:
   receiving a request to read data for a first page, the first page is associated with a first group of non-volatile storage elements in a block of non-volatile storage elements;
   determining whether a second page has been programmed yet, the second page follows the first page in a sequence in which pages are programmed, the second page is associated with a second group of non-volatile storage elements that are neighbors to the first group of non-volatile storage elements;
   determining whether a third page has been programmed yet, the third page is between the first page and the second page in the sequence in which pages are programmed, the third page is associated with a third group of non-volatile storage elements that are neighbors to the first group of non-volatile storage elements;
   applying a first set of read corrections to read the first page when neither the second page nor the third page has yet been programmed, the first set of read corrections compensate for neither the second page nor the third page having been programmed; and
   applying a second set of read corrections to read the first page when the second page has not been programmed but the third page has been programmed, the second set of read corrections compensate for the second page not having been programmed but the third page having been programmed.

2. The method of claim 1, wherein the first group of non-volatile storage elements are associated with a first word line, the second group of non-volatile storage elements are associated with a second word line that neighbors the first word line.

3. The method of claim 2, wherein the first group of non-volatile storage elements are associated with a first set of bit lines that alternates with a second set of bit lines, the second group of non-volatile storage elements are associated with the first set of bit lines, a third page is associated with a third group of non-volatile storage elements that are associated with the first word line and the second set of bit lines.

4. The method of claim 1, wherein the first group of non-volatile storage elements are associated with a first word line and a first set of bit lines that alternates with a second set of bit lines, the second group of non-volatile storage elements are associated with the first word line and the second set of bit lines, a third group of non-volatile storage elements are associated with a second word line that neighbors the first word line, the third group of non-volatile storage elements are associated with the first set of bit lines.

5. The method of claim 1, wherein the first and second read corrections are a function of how much interference is caused by programming of later pages in the sequence.

6. The method of claim 1, wherein the determining whether a second page has been programmed yet includes:

reading dummy non-volatile storage elements in the second group that indicate whether the second page has been programmed yet.

7. The method of claim 1, wherein the determining whether a second page has been programmed yet includes:
accessing a counter that indicates the last page that was programmed in the block.

8. The method of claim 1, wherein the determining whether a second page has been programmed yet includes:
accessing a flag that indicates whether the block is completely programmed or partially programmed.

9. The method of claim 1, wherein the applying read corrections to read the first page includes one or more of the following:
shifting bias of the selected word line from a normal bias level;
shifting bias of one or more unselected word lines from a normal bias level;
shifting bias of selected bit lines from a normal bias level;
shifting bias of a common source line from a normal bias level;
shifting bias of a substrate from a normal bias level; or
changing the time for which a conduction current of a selected memory cell is sensed.

10. A method for operating non-volatile storage comprising:
receiving a request to read data for a first page that is associated with a first group of non-volatile storage elements in a set of non-volatile storage elements, the first page is a first page of pages that are programmed in a sequence, programming at least some of the successive pages in the sequence causes additional interference with the first page;
determining whether at least one page that follows the first page in the sequence and that causes a threshold amount of interference has not yet been programmed, the at least one page is associated with other non-volatile storage elements in the set; and
determining read levels for reading the first page in response to determining that at least one page that follows the first page in the sequence and that causes a threshold amount of interference has not yet been programmed, the read levels are based on the additional interference that would be caused with the first page by later programming of the at least one page that has not yet been programmed, different read levels are used for reading the first page depending on which pages in the sequence have not yet been programmed; and
reading the first page using the determined read levels.

11. The method of claim 10, wherein the determining whether at least one page that follows the first page in the sequence and that causes a threshold amount of interference has not yet been programmed includes:
determining that a second page has not been programmed yet, the first group of non-volatile storage elements are associated with a first word line, the second page is associated with a second group of non-volatile storage elements that are associated with a second word line that neighbors the first word line.

12. The method of claim 11, wherein the determined read levels are based on the interference that would be caused by programming the second page.

13. The method of claim 12, wherein the determining whether at least one page that follows the first page in the sequence and that causes a threshold amount of interference has not yet been programmed includes:
determining that a third page has not yet been programmed, the first group of non-volatile storage elements are associated with a first set of bit lines that alternate with a second set of bit lines, the third page is associated with a third group of non-volatile storage elements that are associated with the first word line and the second set of bit lines, the determined read levels are based on the interference that would be caused by programming the second page and the third page.

14. The method of claim 10, wherein the determining whether at least one page that follows the first page in the sequence and that causes a threshold amount of interference has not yet been programmed includes:
determining that a second page has not yet been programmed, the first group of non-volatile storage elements are associated with a first word line and with a first set of bit lines that alternate with a second set of bit lines, the second page is associated with a second group of non-volatile storage elements that are associated with the first word line and the second set of bit lines, the determined read levels are based on the interference that would be caused by programming the second page.

15. A method for operating non-volatile storage comprising:
receiving a request to read data for a first page stored in a first group of non-volatile storage elements on a first word line and a first set of bit lines that alternates with a second set of bit lines;
determining that either a second page has not been programmed but a third page has been programmed or both the second and third pages have not yet been programmed, a second group of non-volatile storage elements is for storing the second page, a third group of non-volatile storage elements is for storing the third page, the second group of non-volatile storage elements is on a second word line that neighbors the first word line, the third group of non-volatile storage elements is on the first word line and the second set of bit lines; and
applying read corrections to read the first page responsive to the determining, the read corrections compensate for the second page and/or the third page having not yet been programmed, the read corrections compensate for shifts in threshold voltage distributions that would occur due to later programming of at least the second page and/or the third page, the read corrections are based on which of the second and/or third page has not yet been programmed.

16. The method of claim 15, wherein the read corrections compensate for interference that would be caused by programming the second and/or third page.

17. The method of claim 15, wherein the applying read corrections includes:
applying read corrections that compensate for neither the second page nor the third page having yet been programmed when neither the second page nor the third page has yet been programmed.

18. The method of claim 15, wherein the applying read corrections includes:
applying read corrections that compensate for one of the second page or the third page having not yet been programmed when only one of the second page or the third page has not yet been programmed.

19. The method of claim 15, wherein the third page is programmed after the second page in a page programming sequence.

20. The method of claim 15, wherein the third page is programmed between the second page and the first page in a page programming sequence.

21. The method of claim 15, wherein the first page and the second page are upper pages.

22. A non-volatile storage device comprising:
a block of non-volatile storage elements, the non-volatile storage elements include a first group of non-volatile storage elements, a second group of non-volatile storage elements that are neighbors to the first group of non-volatile storage elements and a third group of non-volatile storage elements that are neighbors to the first group of non-volatile storage elements, the first group of non-volatile storage elements are for storing a first page, the second group of non-volatile storage elements are for storing a second page, the third group of non-volatile storage elements are for storing a third page, the second page and the third page follows the first page in a sequence in which pages are programmed; and
one or more management circuits in communication with the block of non-volatile storage elements, the one or management circuits receive a request to read the first page, the one or more management circuits determine whether the second page has been programmed yet, the one or more management circuits determine whether the third page has been programmed yet, the one or more management circuits apply a first set of read corrections to read the first page when neither the second page nor the third page has been programmed yet, the first set of read corrections compensate for neither the second page nor the third page having been programmed, the one or more management circuits apply a second set of read corrections to read the first page when the second page has not been programmed but the third page has been programmed, the second set of read corrections compensate for the second page not having been programmed but the third page having been programmed.

23. The non-volatile storage device of claim 22, further comprising a plurality of word lines, the first group of non-volatile storage elements are associated with a first word line of the plurality of word lines, the second group of non-volatile storage elements are associated with a second word line of the plurality of word lines that neighbors the first word line.

24. The non-volatile storage device of claim 23, further comprising a first set of bit lines and a second set of bit lines that alternate with the first set of bit lines, the first group of non-volatile storage elements are associated with the first set of bit lines, the second group of non-volatile storage elements are associated with the first set of bit lines, the third group of non-volatile storage elements are associated with the first word line and the second set of bit lines.

25. The non-volatile storage device of claim 22, further comprising a plurality of word lines and a first set of bit lines and a second set of bit lines that alternate with the first set of bit lines, the first group of non-volatile storage elements are associated with a first word line of the plurality of word lines and with the first set of bit lines, the second group of non-volatile storage elements are associated with the first word line and the second set of bit lines.

26. A non-volatile storage device comprising:
a plurality of word lines, the plurality of word lines include a first word line and a second word line that neighbors the first word line;
a plurality of bit lines, the plurality of bit lines include a first set of bit lines and a second set of bit lines that alternate with the first set of bit lines;
a set of non-volatile storage elements arranged as NAND strings, the set of non-volatile storage elements includes a first group of non-volatile storage elements for storing a first page, a second group of non-volatile storage elements for storing a second page, and a third group of non-volatile storage elements for storing a third page, the first page is programmed before the second page and the third page in a page sequence, the first group of non-volatile storage elements are associated with the first word line and the first set of bit lines, the second group of non-volatile storage elements are associated with the second word line and with the first set of bit lines, the third group of non-volatile storage elements are associated with the first word line and the second set of bit lines; and
one or more management circuits in communication with the set of non-volatile storage elements, the one or management circuits receive a request to read the first page, the one or more management circuits determine that at least one of the second page or the third page has not yet been programmed, the one or more management circuits apply read corrections to read the first page based on the additional interference that would be caused with the first page by later programming of the third page but not the second page or later programming of both the second and third pages, different read levels are used for reading the first page depending on which of the second and third pages have not yet been programmed.

27. The non-volatile storage device of claim 26, wherein the one or more management circuits apply read corrections that compensate for the second page not having been programmed but for the third page having been programmed when the second page has not been programmed but the third page has been programmed.

28. The non-volatile storage device of claim 26, wherein the one or more management circuits apply read corrections that compensate for the third page not having been programmed but for the second page having been programmed when the third page has not been programmed but the second page has been programmed.

29. The non-volatile storage device of claim 26, wherein the one or more management circuits apply read corrections that compensate for both the second page and the third page having not been programmed when neither the second page nor the third page has yet been programmed.

* * * * *